US012615907B2

(12) United States Patent
Shindou et al.

(10) Patent No.: US 12,615,907 B2
(45) Date of Patent: Apr. 28, 2026

(54) ORGANIC EL DEVICE, DISPLAY APPARATUS, AND METHOD OF MANUFACTURING ORGANIC EL DEVICE

(71) Applicant: XIAMEN TIANMA DISPLAY TECHNOLOGY CO., LTD., Xiamen (CN)

(72) Inventors: Tomohide Shindou, Kawasaki (JP); Shigeru Mori, Kawasaki (JP)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 441 days.

(21) Appl. No.: 18/460,140

(22) Filed: Sep. 1, 2023

(65) Prior Publication Data

US 2024/0090249 A1     Mar. 14, 2024

(30) Foreign Application Priority Data

Sep. 9, 2022    (JP) ................................. 2022-143645
May 23, 2023    (JP) ................................. 2023-084657

(51) Int. Cl.
*H10K 50/11*        (2023.01)
*H10K 59/12*        (2023.01)
*H10K 59/124*       (2023.01)
*H10K 59/80*        (2023.01)

(52) U.S. Cl.
CPC ......... *H10K 50/11* (2023.02); *H10K 59/1201* (2023.02); *H10K 59/124* (2023.02); *H10K 59/80518* (2023.02)

(58) Field of Classification Search
CPC .. H10K 50/11; H10K 59/1201; H10K 59/124; H10K 59/80518
See application file for complete search history.

(56) References Cited

U.S. PATENT DOCUMENTS

| | | | | |
|---|---|---|---|---|
| 2014/0315339 A1* | 10/2014 | Kim | ................. | H10K 59/80522 438/34 |
| 2014/0349070 A1* | 11/2014 | Chu | ................. | H10K 59/80518 204/192.1 |
| 2016/0190521 A1* | 6/2016 | Lee | ..................... | H10K 59/121 257/40 |

FOREIGN PATENT DOCUMENTS

JP            2015050011 A       3/2015

* cited by examiner

*Primary Examiner* — Anne M Hines
(74) *Attorney, Agent, or Firm* — NIXON & VANDERHYE

(57)            ABSTRACT

An organic EL device includes organic layers, an anode electrode, a cathode electrode, and an insulating layer covering a part of the anode electrode. The anode electrode is disposed above a bank layer and in an opening of the bank layer. The organic layers cover the anode electrode and a part of the insulating layer. The anode electrode includes a lower conductive layer, a reflective metal layer that reflects light coming from the organic layers, and a light-transmissive upper conductive layer layered in this order toward the cathode electrode. The upper conductive layer includes a first upper conductive layer connected to the organic layers and a second upper conductive layer covered with the insulating layer. The second upper conductive layer has a lower oxygen content than the first upper conductive layer. The second upper conductive layer has a higher resistivity than the first upper conductive layer.

9 Claims, 21 Drawing Sheets

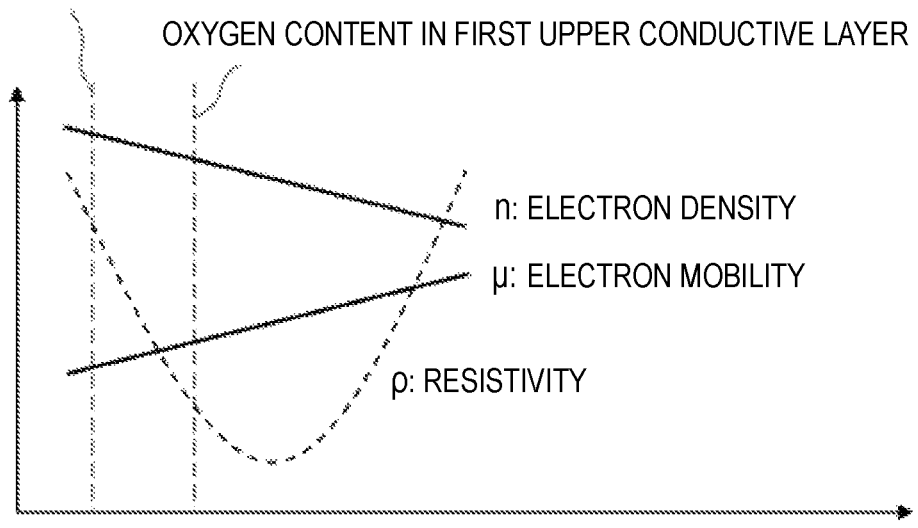

OXYGEN CONTENT IN SECOND UPPER CONDUCTIVE LAYER

OXYGEN CONTENT IN FIRST UPPER CONDUCTIVE LAYER n: ELECTRON DENSITY

μ: ELECTRON MOBILITY

ρ: RESISTIVITY

OXYGEN CONTENT IN UPPER CONDUCTIVE LAYER (ITO)

*FIG. 11*

| | SECOND UPPER CONDUCTIVE LAYER | FIRST UPPER CONDUCTIVE LAYER |
|---|---|---|
| OXYGEN CONTENT | LOW | HIGH |
| RESISTIVITY | HIGH | LOW |
| EFFECT | SUPPRESS HOLE INJECTION TO ORGANIC LAYERS | FACILITATE HOLE INJECTION TO ORGANIC LAYERS |

*FIG. 12*

START

PRODUCE ANODE ELETRODE ~ S10

DEPOSIT INSULATING LAYER ~ S20

DEPOSIT AND PATTERN RESIST ~ S30

APPLY DRY-ETCHING TO INSULATING LAYER ~ S40

REMOVE RESIST ~ S50

TREAT WITH O PLASMA ~ S60

DEPOSIT ORGANIC LAYERS ~ S70

DEPOSIT CATHODE ELECTRODE ~ S80

END

OXYGEN FLOW RATE [sccm]

| | | OXYGEN CONTENT OF SECOND UPPER CONDUCTIVE LAYER < OXYGEN CONTENT OF FIRST UPPER CONDUCTIVE LAYER | OXYGEN CONTENT OF SECOND UPPER CONDUCTIVE LAYER = OXYGEN CONTENT OF FIRST UPPER CONDUCTIVE LAYER |
|---|---|---|---|
| THICKNESS OF SiN FILM =200nmz | DOES LIGHT-EMITTING REGION HAVE INTENDED AREA? | ○ | ○ |
| | FRONTAL BRIGHTNESS (RATIO TO CONVENTIONAL STRUCTURE) | 1.15 | 1.15 |
| THICKNESS OF SiN FILM =100nmz | DOES LIGHT-EMITTING REGION HAVE INTENDED AREA? | ○ | ○ |
| | FRONTAL BRIGHTNESS (RATIO TO CONVENTIONAL STRUCTURE) | 1.17 | 1.17 |
| THICKNESS OF SiN FILM =50nmz | DOES LIGHT-EMITTING REGION HAVE INTENDED AREA? | ○ | × (LARGER THAN INTENDED) |
| | FRONTAL BRIGHTNESS (RATIO TO CONVENTIONAL STRUCTURE) | 1.19 | — |

*FIG. 20*

ENLARGED VIEW

TOP PLAN DIAGRAM

CROSS-SECTIONAL DIAGRAM

ORGANIC EL DEVICE, DISPLAY APPARATUS, AND METHOD OF MANUFACTURING ORGANIC EL DEVICE

CROSS-REFERENCE TO RELATED APPLICATIONS

This non-provisional application claims priority under 35 U.S.C. § 119(a) on Patent Application No. 2022-143645 filed in Japan on Sep. 9, 2022 and Patent Application No. 2023-84657 filed in Japan on May 23, 2023, the entire contents of which are hereby incorporated by reference.

BACKGROUND

This disclosure relates to an organic EL device, a display apparatus, and a method of manufacturing the organic EL device.

A top-emission organic electroluminescence (EL) device is structured in such a manner that a bank layer having an opening is provided above an anode electrode and organic layers and a cathode electrode are layered above the bank layer and the anode electrode exposed from the opening. The anode electrode is a reflective electrode to reflect light emitted toward the anode electrode. The anode electrode is insulated from the organic layers by an insulating layer in the periphery of the opening.

The light emitted from the light-emitting layer also enters the bank layer. The light that has entered the bank layer repeatedly reflects off the inside of the bank layer, propagates in the horizontal directions of the panel, and eventually turns into heat and dissipates. The light that has entered the bank layer is useless because it cannot be extracted to the external; therefore, a top-emission organic EL device usually has low light-extraction efficiency.

For example, JP 2015-050011 A discloses a configuration such that a light-reflective electrode is provided on a tilted surface of a stepped portion of an insulating layer corresponding to the opening of the bank layer. The reflective electrode on the tilted surface reduces the light entering the insulating layer; therefore, the light-extraction efficiency increases.

SUMMARY

An aspect of this disclosure is an organic EL device including: organic layers; an anode electrode configured to inject holes into the organic layers; a cathode electrode configured to inject electrons into the organic layers; and an insulating layer covering a part of the anode electrode. The anode electrode is disposed above a bank layer and in an opening of the bank layer. The organic layers are disposed to cover the anode electrode and a part of the insulating layer. The anode electrode includes a lower conductive layer, a reflective metal layer that reflects light coming from the organic layers, and a light-transmissive upper conductive layer layered in this order toward the cathode electrode. The upper conductive layer includes a first upper conductive layer connected to the organic layers and a second upper conductive layer covered with the insulating layer. The second upper conductive layer has a lower oxygen content than the first upper conductive layer. The second upper conductive layer has a higher resistivity than the first upper conductive layer.

An aspect of this disclosure is a method of manufacturing an organic EL device, the method including: a step of producing an anode electrode including a lower conductive layer, a reflective metal layer, and a light-transmissive upper conductive layer layered in this order toward a cathode electrode above a bank layer and in an opening of the bank layer; a step of producing an insulating layer covering a part of the anode electrode; and a step of applying oxygen plasma treatment to the upper conductive layer of the anode electrode exposed from the insulating layer.

It is to be understood that both the foregoing general description and the following detailed description are exemplary and explanatory and are not restrictive of this disclosure.

BRIEF DESCRIPTION OF THE DRAWINGS

FIG. 11 is a chart illustrating physical properties of an upper conductive layer of an anode electrode.

FIG. 12 is a chart summarizing the characteristics of the upper conductive layer.

FIG. 20 is a chart demonstrating effects of Embodiment 1.

EMBODIMENTS

Embodiment 1

Hereinafter, embodiments of this disclosure will be described with reference to the drawings. Throughout the drawings for illustrating the embodiments, the same components are generally assigned the same reference signs and their repetitive description is skipped as appropriate.

Configuration of Organic EL Display Apparatus

The following description is about the configuration of an organic EL display apparatus including organic EL devices of this disclosure, which is an example of a display apparatus.

Figure 1:
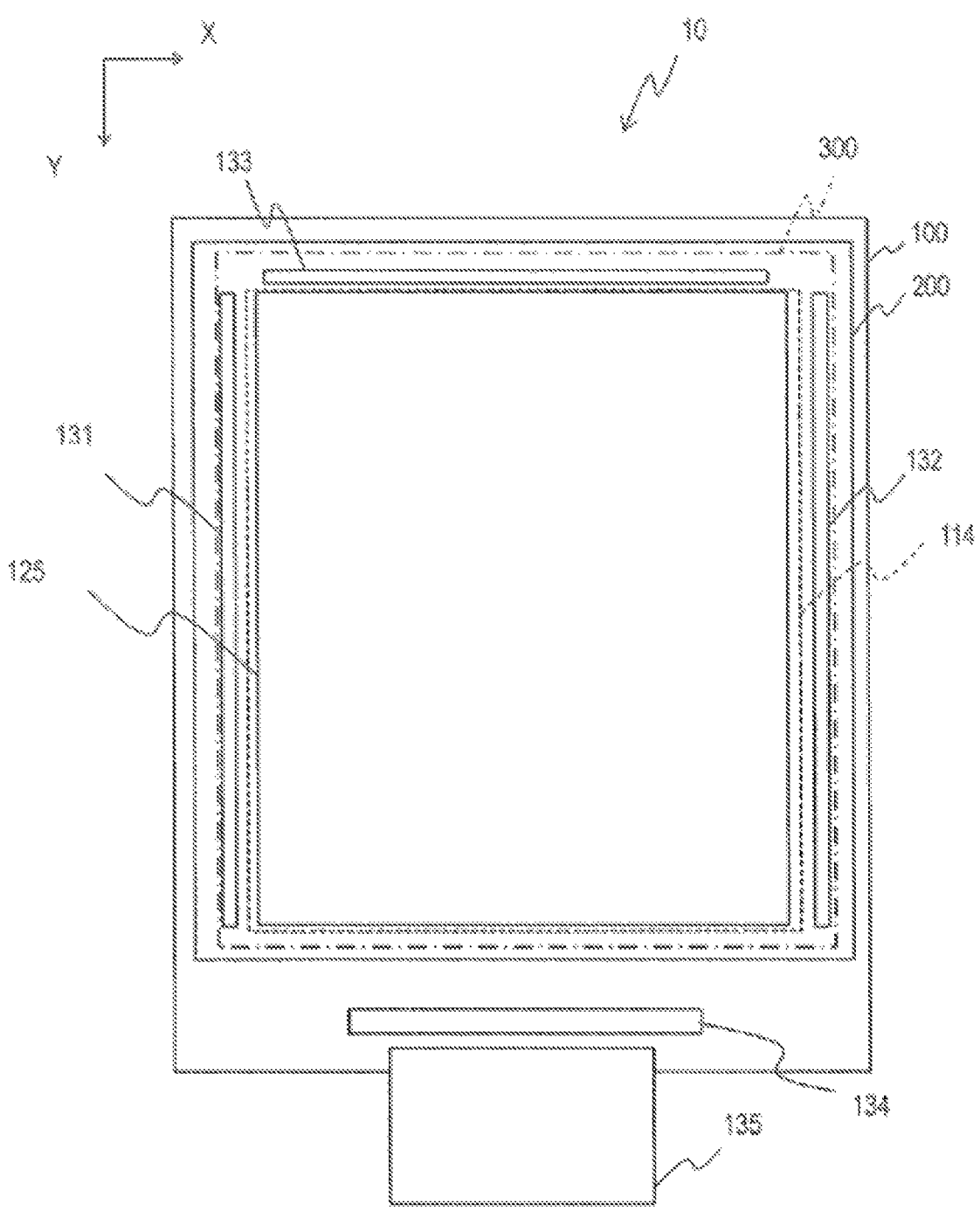
FIG. 1 is a diagram schematically illustrating an example of the configuration of an organic EL display apparatus of this disclosure.

FIG. 1 is a diagram schematically illustrating an example of the configuration of an organic EL display apparatus of this disclosure. As illustrated in FIG. 1, the organic EL display apparatus 10 includes a thin-film transistor (TFT) panel 100 on which organic EL devices are fabricated, an encapsulation panel 200 for encapsulating the organic EL devices, and a bond (glass frit sealer) 300 for bonding the TFT panel 100 and the encapsulation panel 200. The space between the TFT panel 100 and the encapsulation panel 200 is filled with dry air and sealed up with the bond 300. Nitrogen can be used as the dry air.

The organic EL display apparatus is not limited to have this configuration. The organic EL display apparatus can have a configuration such that an inorganic film such as a silicon nitride film and an organic film such as a polymer film are layered to encapsulate the organic EL devices, in place of the encapsulation panel 200.

In the periphery of a cathode electrode region 114 outer than the display region 125 of the TFT panel 100, a scanning driver 131, a control driver 132, a protection circuit 133, and a driver IC (driver circuit) 134 are disposed. The driver IC 134 is connected to the external devices via flexible printed circuits (FPC) 135.

The display region 125 of the TFT panel 100 includes a plurality of pixels arrayed in a matrix. Each pixel includes a plurality of subpixels. Each subpixel includes an organic EL device. The organic EL device of each subpixel emits light and stops emitting light in accordance with the control of the scanning driver 131 and the control driver 132.

The scanning driver 131 drives scanning lines on the TFT panel 100. The control driver 132 drives emission control lines to control the light emission periods of subpixels. The control driver 132 further drives reset control lines to reset the light emission periods of the subpixels.

The driver IC 134 provides power and timing signals (control signals) to the scanning driver 131 and the control driver 132 and further, provides data signals to data lines. The driver IC 134 is mounted with an anisotropic conductive film (ACF), for example.

In FIG. 1, the horizontally extending axis is referred to as x-axis and the vertically extending axis as y-axis. The scanning lines extend along the x-axis. The pixels or subpixels aligned along the x-axis within the display region 125 are referred to as a row of pixels or subpixels. The pixels or subpixels aligned along the y-axis within the display region 125 are referred to as a column of pixels or subpixels.

Figure 2:
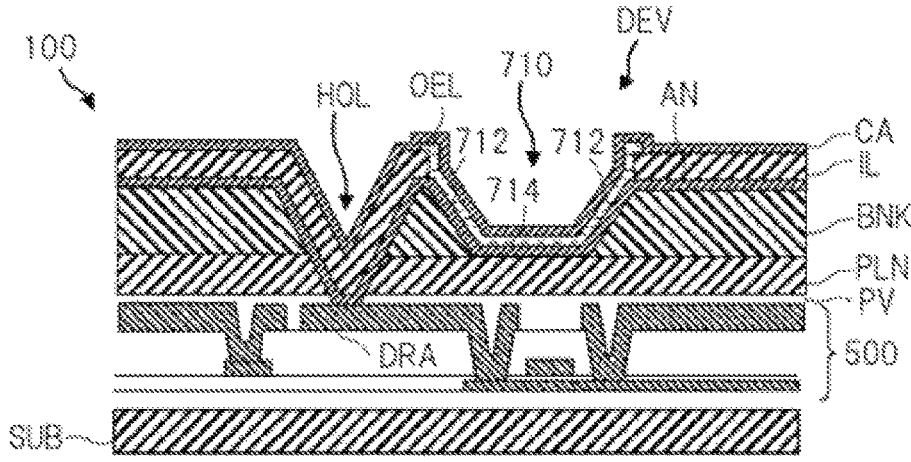
FIG. 2 is a cross-sectional diagram schematically illustrating an example of the configuration of a TFT panel.
Figure 3:
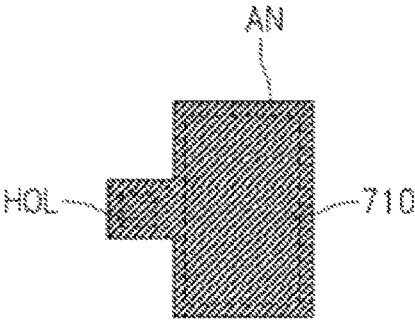
FIG. 3 is a diagram schematically illustrating the shape of an anode electrode in a planar view.

FIG. 2 is a cross-sectional diagram schematically illustrating an example of the configuration of a TFT panel. FIG. 3 is a diagram schematically illustrating the shape of an anode electrode in a planar view. The TFT panel 100 includes pixel circuits including TFTs on the lower side closer to the support substrate SUB and further includes organic EL devices above the pixel circuits.

As illustrated in FIG. 2, the TFT panel 100 includes a support substrate SUB made of glass or polyimide, pixel circuits 500 fabricated on the support substrate SUB, a planarization layer PLN provided above the pixel circuits 500, and organic EL devices DEV fabricated above the planarization layer PLN.

A bank layer BNK has openings 710 each surrounded by an inclined wall region 712 of the bank layer BNK. In other words, an opening 710 has a region defined by the inclined wall region 712 and a bottom region 714 from which the planarization layer PLN (a connection electrode CON in FIG. 4 to be described later) is exposed. The organic layers OEL of an organic EL device DEV are provided inside an opening 710 and in a region surrounding the opening 710, as illustrated in FIG. 2. Hence, each pixel or an organic EL device DEV emits light mainly in an opening 710.

As illustrated in FIGS. 2 and 3, the anode electrode AN of an organic EL device DEV is directly connected to a drain electrode DRA in a pixel circuit 500 exposed in a contact hole HOL extending through the bank layer BNK, the planarization layer PLN, and a passivation film PV. In this case, the carriers flowing from the drain electrode DRA into the anode electrode AN mainly flow within a thick and low-resistive reflective metal layer RML and they are not affected by an upper conductive layer UCL or a lower conductive layer LCL (see FIG. 8).

As illustrated in FIG. 3, the contact hole HOL in a planar view is sufficiently small, compared to the opening 710 of the bank layer BNK. The contact hole HOL interferes little with the area of the opening 710 of the bank layer BNK even in the case where the anode electrode AN is directly connected to the drain electrode DRA through the contact hole HOL.

Figure 4:
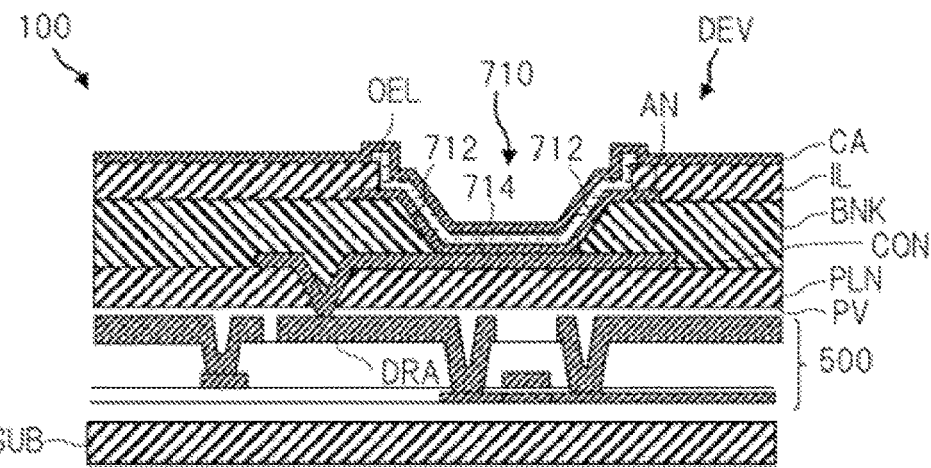
FIG. 4 is a cross-sectional diagram schematically illustrating another example of the configuration of a TFT panel including organic EL devices of this disclosure.

FIG. 4 is a cross-sectional diagram schematically illustrating another example of the configuration of a TFT panel including organic EL devices of this disclosure. As illustrated in FIG. 4, the anode electrode AN of the organic EL device DEV can be connected to the drain electrode DRA through a connection electrode CON provided above the planarization layer PLN. In this case, a contact hole HOL separate from the opening 710 of the bank layer BNK is not necessary as noted from FIG. 4; there is no interference with the area of the opening 710 of the bank layer BNK.

Configuration of Organic EL Device

Figure 5:
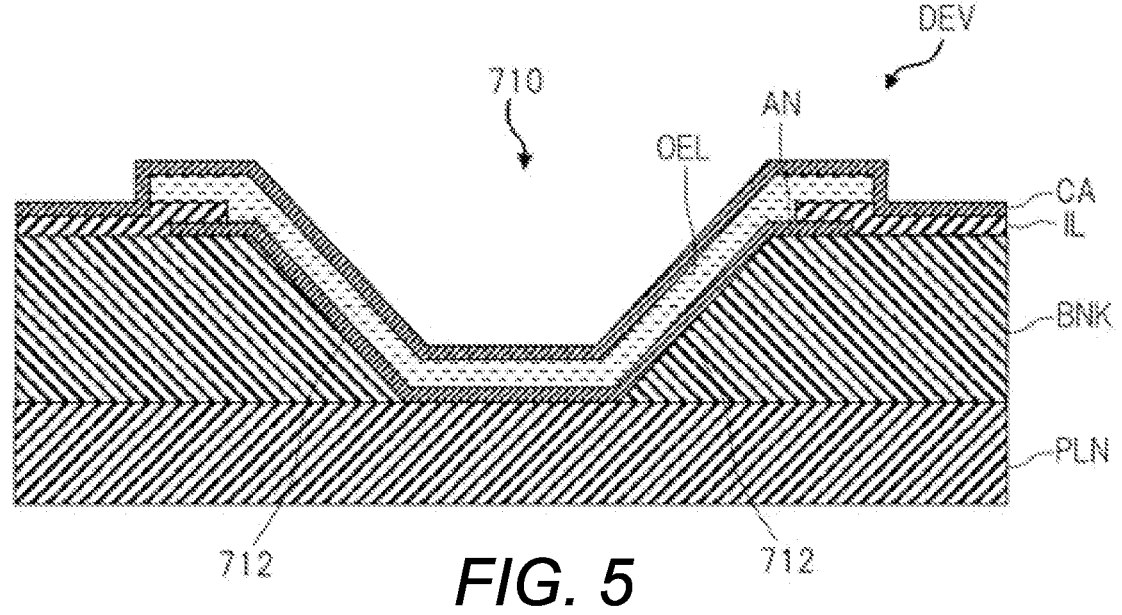
FIG. 5 is a cross-sectional diagram schematically illustrating an example of the configuration of the vicinity of a pixel including the organic EL device of this disclosure.

FIG. 5 is a cross-sectional diagram schematically illustrating an example of the configuration of the vicinity of a pixel including the organic EL device of this disclosure. FIG. 5 illustrates only the planarization layer PLN and the bank layer BNK and the organic EL device DEV upper than the planarization layer PLN; it does not include the configuration for supplying electric current to the anode electrode AN, such as the support substrate SUB and a pixel circuit 500.

As illustrated in FIG. 5, the bank layer BNK is provided above the planarization layer PLN. The bank layer BNK is an organic film made of polyimide or acrylic resin, for example. The bank layer BNK has an opening 710 widening from the planarization layer PLN toward the organic EL device DEV. In FIG. 5, the opening 710 passes through the bank layer BNK to expose the planarization layer PLN. The top face of the bank layer BNK is flat.

As illustrated in FIG. 5, the anode electrode AN is provided above the bank layer BNK in the region surrounding the opening 710 and in the opening 710. An insulating layer IL is provided above the bank layer BNK. The insulating layer IL covers a part of the anode electrode AN above the bank layer BNK. The insulating layer IL can be a SiN film (inorganic insulating film) containing hydrogen (H) but is not limited to this example. For example, a hydrogen-containing inorganic insulating film other than SiN, an inorganic insulating film containing a reducible component, or a hardly-oxidized organic insulating film can be employed for the insulating layer IL.

Organic layers OEL are provided to cover the anode electrode AN and a part of the insulating layer IL. A cathode electrode CA is provided to cover the organic layers OEL and the insulating layer IL. The cathode electrode CA can be provided to cover the entire display region 125. The details of the cathode electrode CA will be described later.

Figure 6:
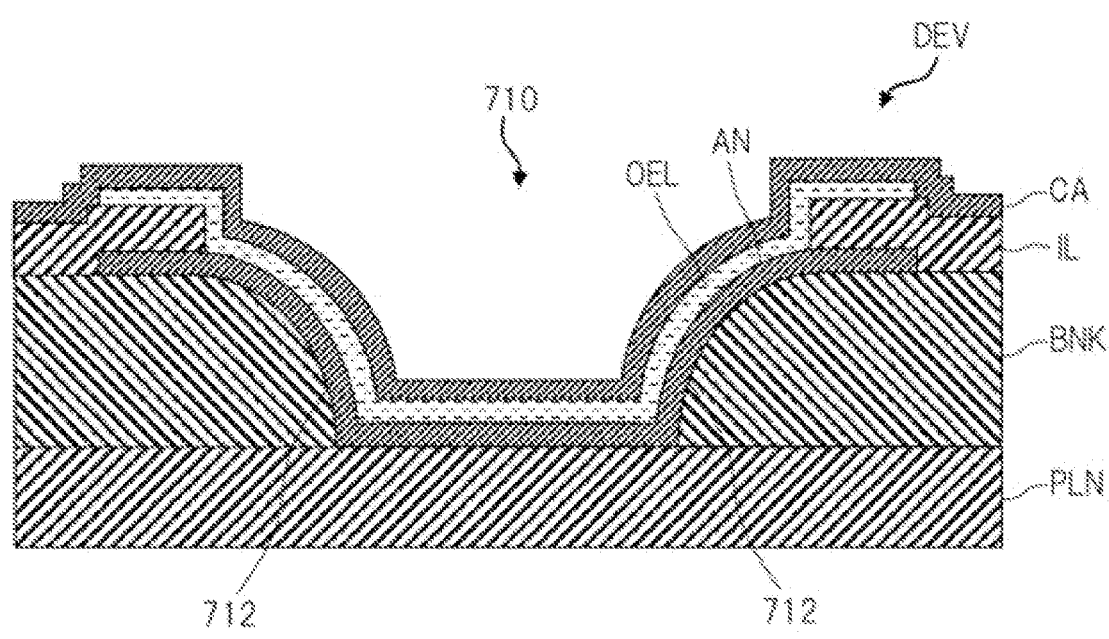
FIG. 6 is a cross-sectional diagram schematically illustrating another example of the configuration of the vicinity of a pixel including the organic EL device of this disclosure.

FIG. 6 is a cross-sectional diagram schematically illustrating another example of the configuration of the vicinity of a pixel including the organic EL device of this disclosure. Like FIG. 5, FIG. 6 does not include the configuration for supplying electric current to the anode electrode AN. Concerning the opening 710 of the bank layer BNK, the inclined wall region 712 can be less steep than the example in FIG. 5, as illustrated in FIG. 6. Furthermore, the inclined wall region 712 can be smoothly connected to the top edge of the bank layer BNK, as illustrated in FIG. 6. This is because the bank layer BNK can be made of the aforementioned organic film and its inclined wall region 712 could be shaped less steep depending on the baking conditions in preparing the bank layer. For example, when the bank layer BNK is baked at a temperature higher than 150° C., the inclined wall region 712 can be shaped like this example. This disclosure includes such configurations.

Figure 7:
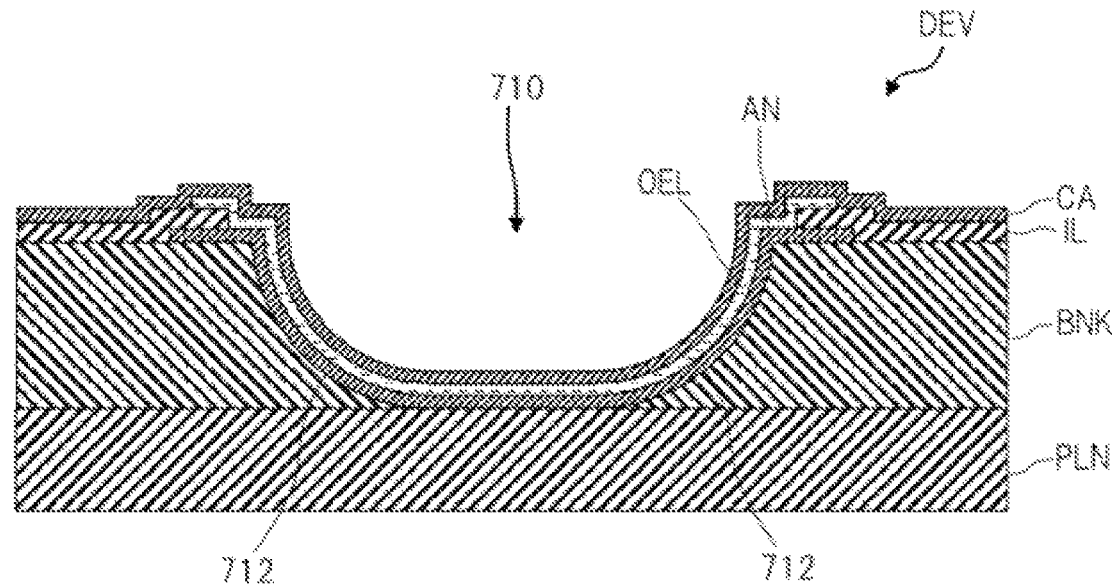
FIG. 7 is a cross-sectional diagram schematically illustrating still another example of the configuration of the vicinity of a pixel including the organic EL device of this disclosure.

FIG. 7 is a cross-sectional diagram schematically illustrating still another example of the configuration of the vicinity of a pixel including the organic EL device of this disclosure. Like FIG. 6, FIG. 7 does not include the configuration for supplying electric current to the anode electrode AN. As illustrated in FIG. 7, the inclined wall region 712 of the bank layer BNK can be curved outward, opposite to the inclined wall region in FIG. 6. The bank layer BNK is prepared in such a shape by providing an inorganic film above the bank layer BNK, patterning the inorganic film, isotropically etching the bank layer BNK, and selectively removing the patterned inorganic film above the bank layer BNK. This disclosure includes such a configuration.

Figure 8:
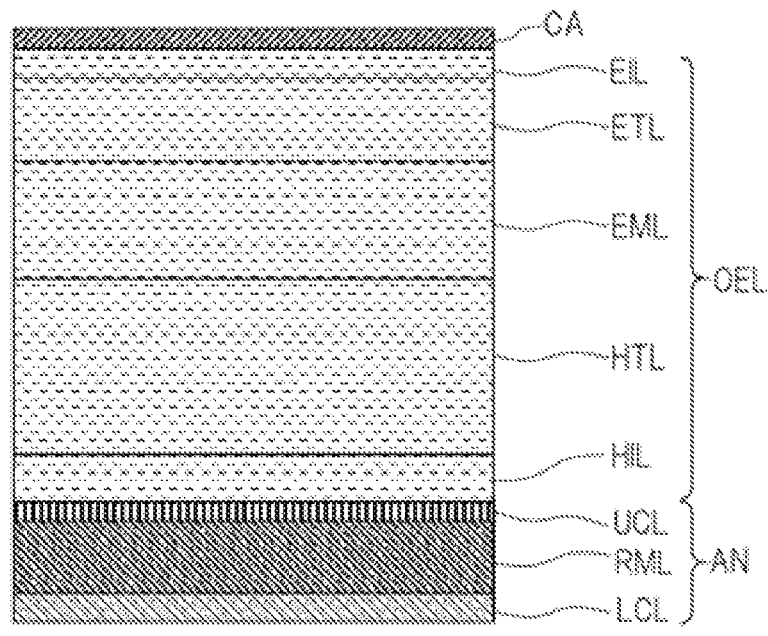
FIG. 8 is a diagram illustrating an example of the cross-sectional configuration of an organic EL device.

FIG. 8 is a diagram illustrating an example of the cross-sectional configuration of an organic EL device. As illustrated in FIG. 8, the organic EL device DEV includes a hole injection layer HIL in contact with the anode electrode AN, a hole transport layer HTL, a light-emitting layer EML, an electron transport layer ETL, an electron injection layer EIL in contact with a cathode electrode CA layered in this order above the anode electrode AN.

For a top-emission organic EL device, a thin film of a semi-transparent reflective metal is used for the cathode electrode to attain a resonator (microcavity) structure, in which the light emitted from the light-emitting layer is repeatedly reflected between the anode electrode and the cathode electrode and only the light having the resonant wavelength corresponding to the optical distance is amplified and extracted to the external.

As illustrated in FIG. 8, the anode electrode AN includes a lower conductive layer LCL, a reflective metal layer RML, and an upper conductive layer UCL; these are layered in this order toward the cathode electrode CA. The lower conductive layer LCL is an electrode to be connected to the aforementioned drain electrode DRA. The lower conductive layer LCL can be a transparent conductive film made of indium tin oxide (ITO), indium zinc oxide (IZO), zinc oxide (ZnO), or indium oxide ($In_2O_3$) or an opaque conductive film made of titanium (Ti), chromium (Cr), or aluminum (Al). The reflective metal layer RML is a layer that reflects light coming from the organic layers OEL. The reflective metal layer RML is not limited to a specific one as far as it reflects light. For example, a metal such as silver (Ag), aluminum (Al), magnesium (Mg), platinum (Pt), palladium (Pd), gold (Au), nickel (Ni), neodymium (Nd), iridium (Ir), or chromium (Cr) or an alloy containing one or more of these metals can be used for the reflective metal layer RML.

The upper conductive layer UCL is a light-transmissive electrode to be connected to the hole injection layer HIL of the organic layers OEL and the insulating layer IL. The upper conductive layer UCL can be a transparent conductive film made of ITO, IZO, ZnO, or $In_2O_3$ to make light reflect off the reflective metal layer RML.

Figure 9:
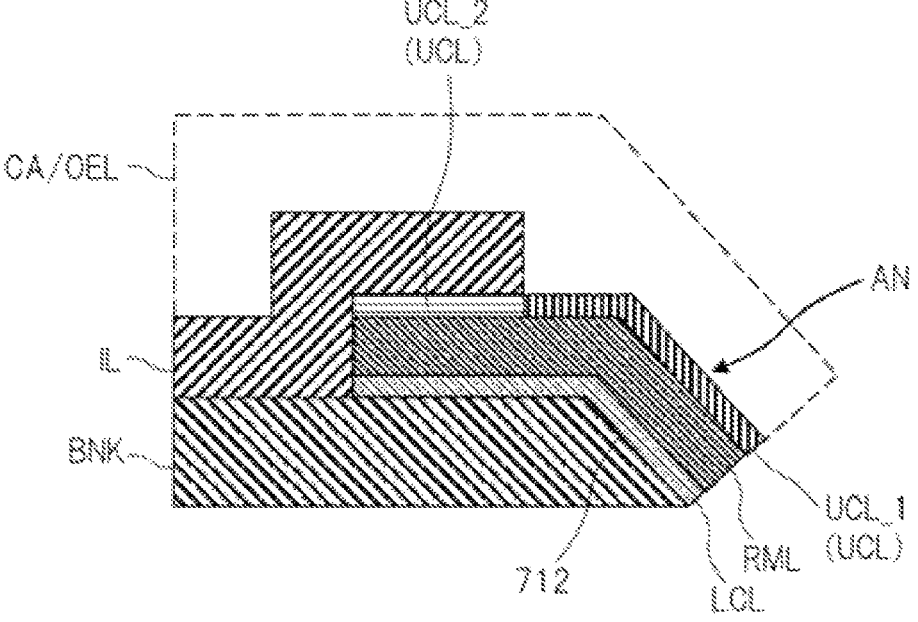
FIG. 9 is a cross-sectional diagram illustrating a detailed configuration of an upper conductive layer.

FIG. 9 is a cross-sectional diagram illustrating a detailed configuration of the upper conductive layer. FIG. 9 provides an enlarged view of the region where the anode electrode AN is covered with the insulating layer IL. As illustrated in FIG. 9, the upper conductive layer UCL includes a first upper conductive layer UCL_1 in the region not covered with the insulating layer IL but connected to the organic layers OEL and a second upper conductive layer UCL_2 in the region covered with the insulating layer IL. The second upper conductive layer UCL_2 has a lower oxygen content and a higher resistivity than the first upper conductive layer UCL_1. This configuration facilitates injection of holes to the organic layers OEL in contact with the first upper conductive layer UCL_1 but suppresses the leak current through the insulating layer IL in contact with the second upper conductive layer UCL_2. As a result, the light-emitting region of the organic layers OEL is controlled to the inside of the opening of the insulating layer IL or the region in contact with the first upper conductive layer UCL_1.

Figure 10A:
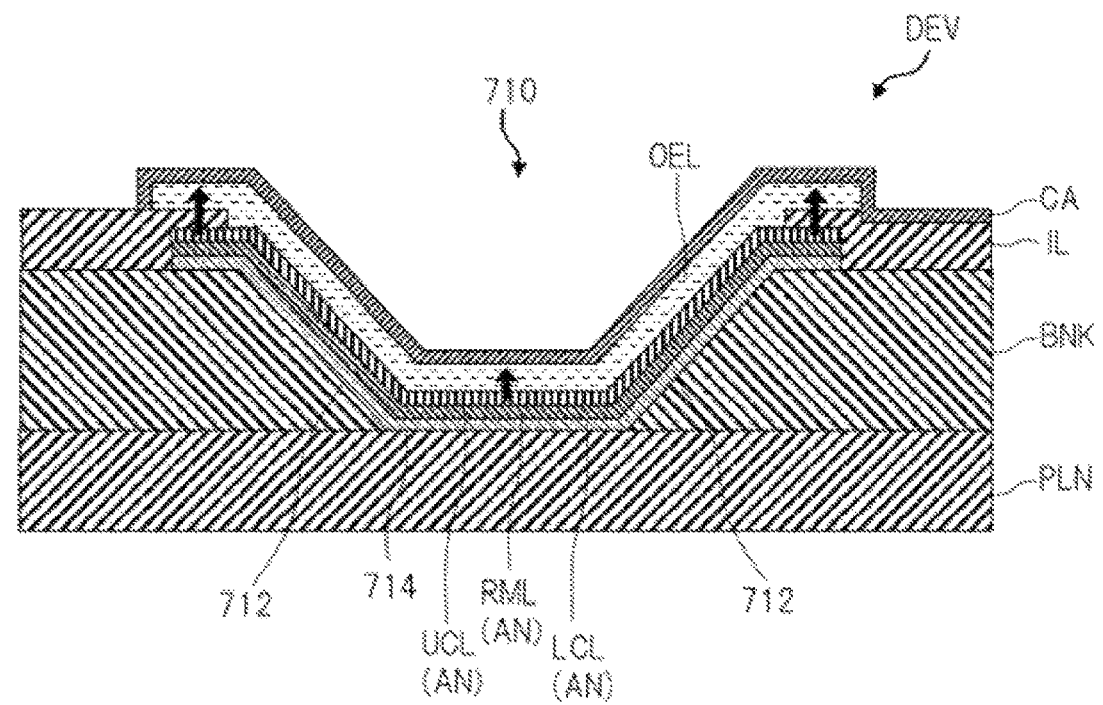
FIGS. 10A and 10B are a diagrams illustrating comparison of the leak path through an insulating layer in a related art and the leak path through an insulating layer in this disclosure.
Figure 10B:
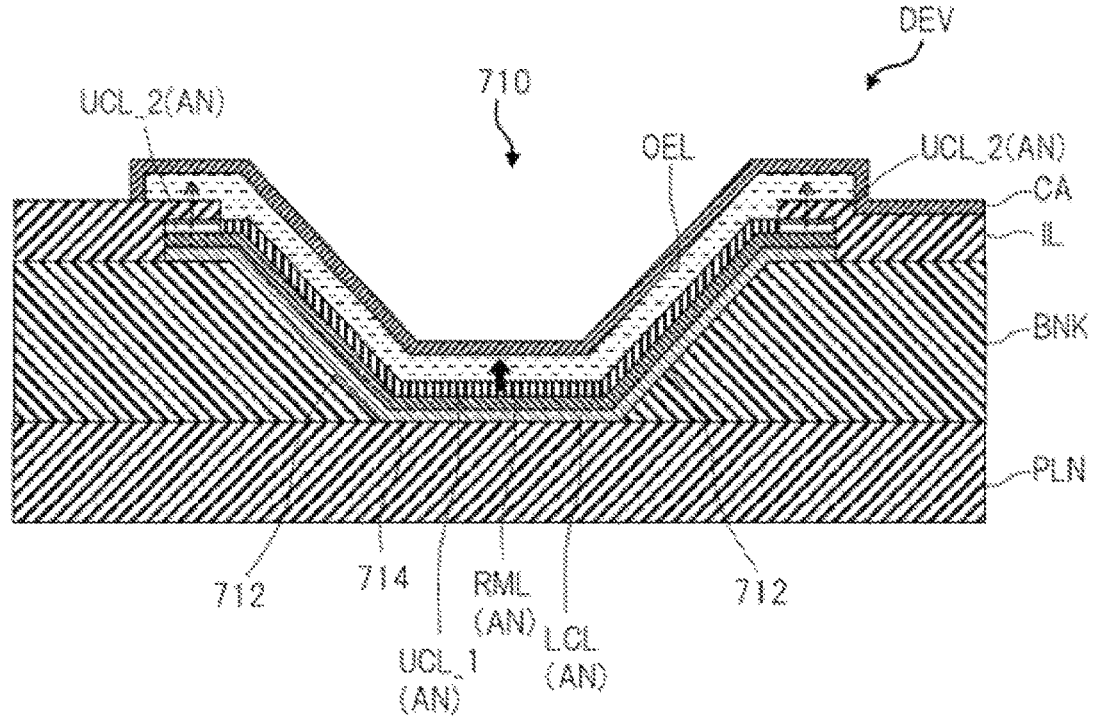

The leak path through the insulating layer is described while comparing a related art and this disclosure. FIGS. 10A and 10B are diagrams illustrating comparison of the leak path through the insulating layer in the related art and the leak path through the insulating layer in this disclosure. FIG. 10A illustrates the leak path through the insulating layer in the related art. FIG. 10B illustrates the leak path through the insulating layer in this disclosure.

In the related art, the upper conductive layer UCL has a substantially uniform oxygen content across the whole region; there is little difference in oxygen content between the regions corresponding to the first upper conductive layer UCL_1 and the second upper conductive layer UCL_2 in this disclosure. For this reason, holes are injected to the organic layers OEL through the insulating layer IL from not only the region corresponding to the first upper conductive layer UCL_1 but also the region corresponding to the second upper conductive layer UCL_2. As understood from this, the related art has a leak path of holes from the region corresponding to the second upper conductive layer UCL_2 to the organic layers OEL through the insulating layer. Accordingly, the organic layers OEL in the related art emits light not only in the region in contact with the first upper conductive layer UCL_1 but also in the region overlapping the region corresponding to the second upper conductive layer UCL_2 in a planar view; the light-emitting region of the organic layers OEL cannot be controlled to a predetermined range.

In this disclosure, however, the second upper conductive layer UCL_2 has a lower oxygen content than the first upper conductive layer UCL_1 and further, the second upper conductive layer UCL_2 has a higher resistivity than the first upper conductive layer UCL_1, as described above. For these reasons, this disclosure has a leak path in which holes flow from the second upper conductive layer UCL_2 to the organic layers OEL through the insulating layer IL, but the leak current in this disclosure is much lower than in the related art. Accordingly, the region overlapping the second upper conductive layer UCL_2 in this disclosure emits little light and the light-emitting region of the organic layers OEL can be controlled to a predetermined range.

Furthermore, the anode electrode AN including a reflective metal layer RML makes the light entering the anode electrode AN from the organic layers OEL reflect toward the encapsulation panel 200, so that higher light-extraction efficiency is attained.

Physical Properties of Upper Conductive Layer

FIG. 11 is a chart illustrating physical properties of the upper conductive layer of an anode electrode. FIG. 11 indicates properties of electron mobility, electron density n, and resistivity $\rho$ in relation to the oxygen content in the upper conductive layer UCL made of ITO.

As noted from FIG. 11, the electron mobility increases as the oxygen content in ITO increases and decreases as the oxygen content in the ITO decreases. The electron density n decreases as the oxygen content in the ITO increases and increases as the oxygen content in the ITO decreases. The resistivity $\rho$ determined depending on the balance between the electron mobility and the electron density n is minimized when the oxygen content in the ITO is a specific value and increases as the oxygen content in the ITO deviates from the specific value.

FIG. 12 is a chart summarizing the characteristics of the upper conductive layer. FIG. 12 provides comparison of the characteristics of the physical properties between the first upper conductive layer UCL_1 and the second upper conductive layer UCL_2 to be considered in specifying these layers. As indicated in FIG. 12, the second upper conductive layer UCL_2 is specified to have a lower oxygen content than the first upper conductive layer UCL_1 so as to have a higher resistivity $\rho$. This configuration suppresses injection of holes into the organic layers OEL through the insulating layer IL. In contrast, the first upper conductive layer UCL_1 is specified to have a higher oxygen content than the second upper conductive layer UCL_2 so as to have a lower resistivity $\rho$. This configuration facilitates injection of holes into the organic layers OEL.

Method of Manufacturing Organic EL Device

Figure 13:
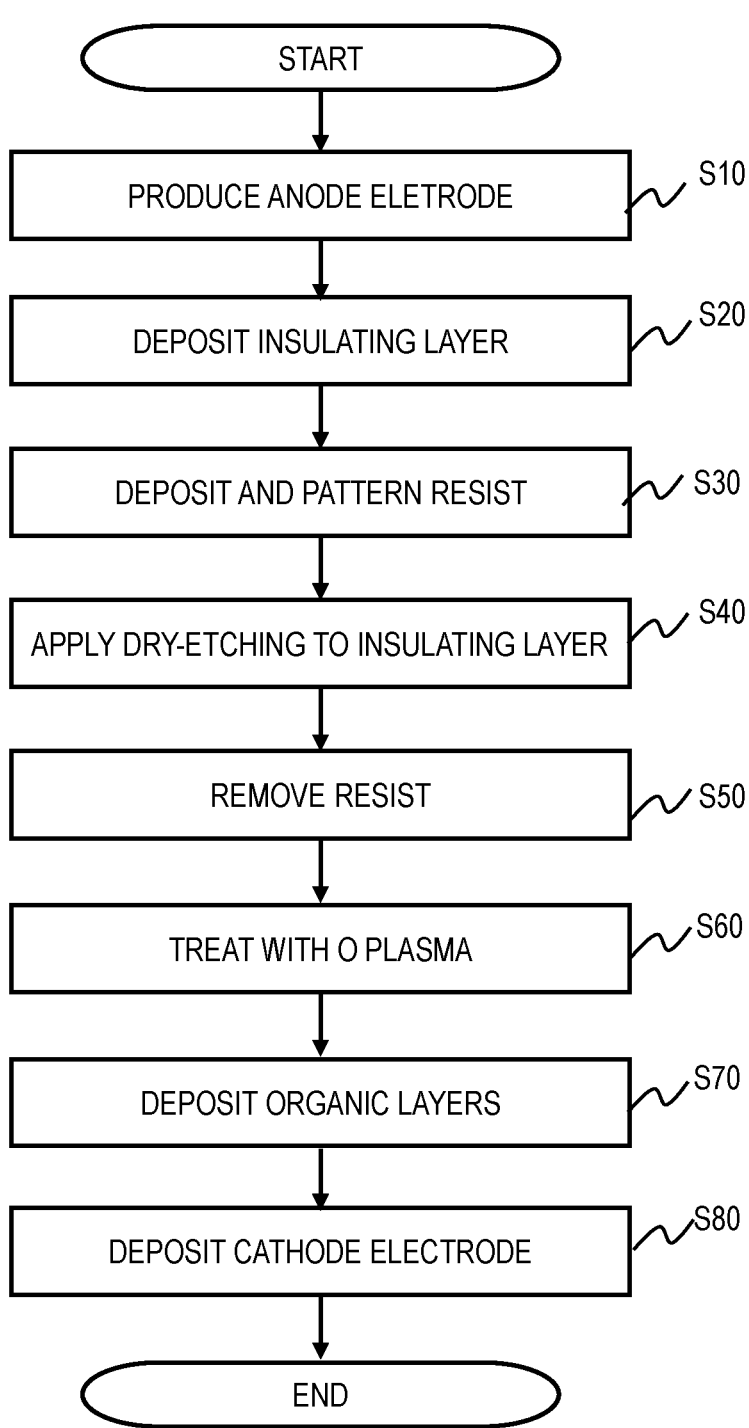
FIG. 13 is a flowchart of an example of the method of manufacturing an organic EL device in Embodiment 1.
Figure 14:
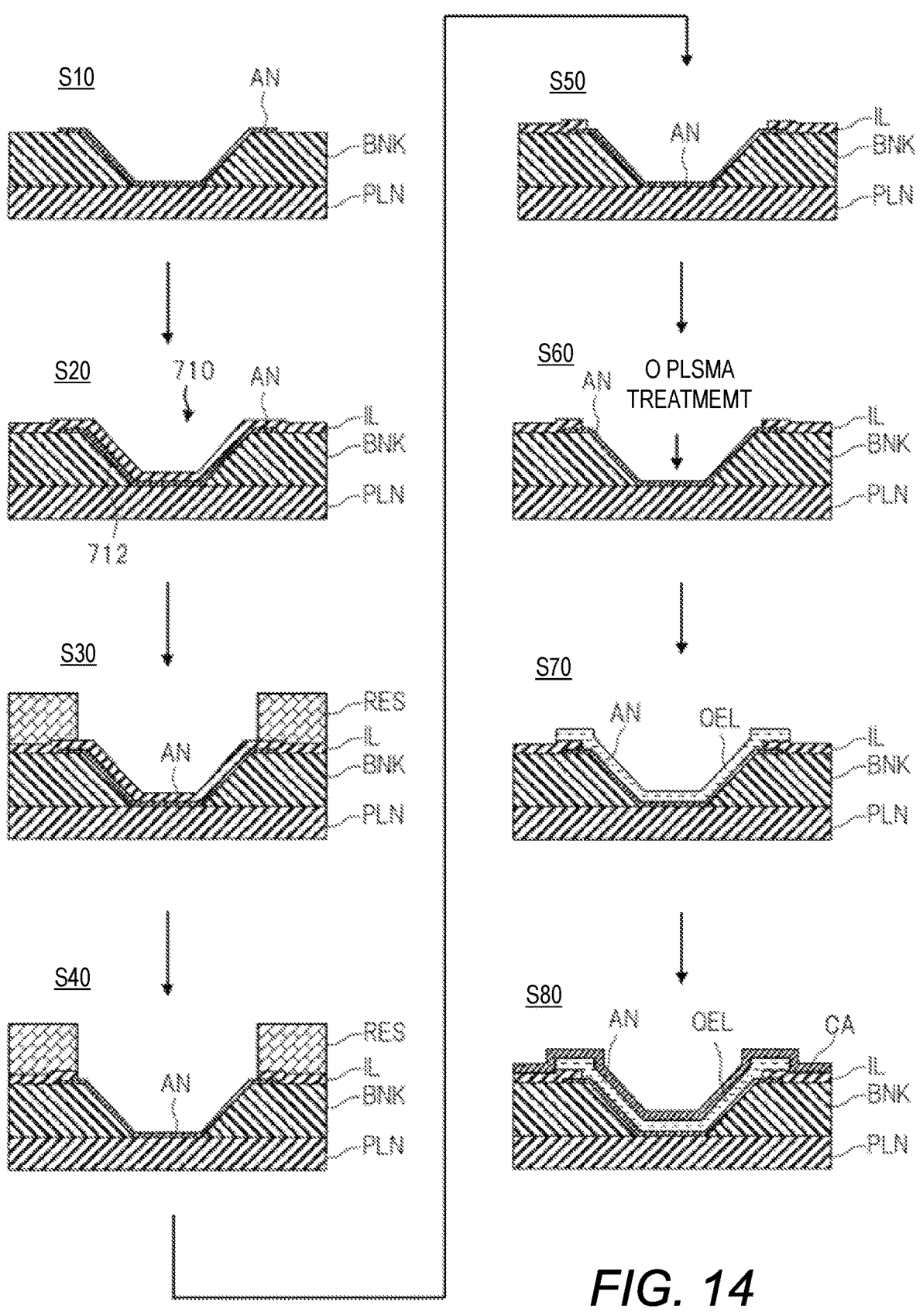
FIG. 14 is a diagram illustrating the process steps in manufacturing an organic EL device that correspond to FIG. 13.

FIG. 13 is a flowchart of an example of the method of manufacturing an organic EL device in Embodiment 1. FIG. 14 is a diagram illustrating the process steps in manufacturing an organic EL device that correspond to FIG. 13. FIG.

14 illustrates only the configuration of the planarization layer PLN and the layers upper than the planarization layer PLN and does not include the configuration for supplying electric current to the anode electrode AN, like FIG. 5.

At Step S10, the method produces an anode electrode AN above the planarization layer PLN and the bank layer BNK. As to the anode electrode AN, the lower conductive layer LCL is produced first. Then, the reflective metal layer RML and the upper conductive layer UCL are produced successively above the lower conductive layer LCL. The lower conductive layer LCL, the reflective metal layer RML, and the upper conductive layer UCL can be produced successively without being exposed to the atmospheric air. The lower conductive layer LCL, the reflective metal layer RML, and the upper conductive layer UCL can be produced by physical vapor deposition (PVD) such as sputtering, ion plating, or vacuum vapor deposition, or chemical vapor deposition (CVD).

Figure 15:
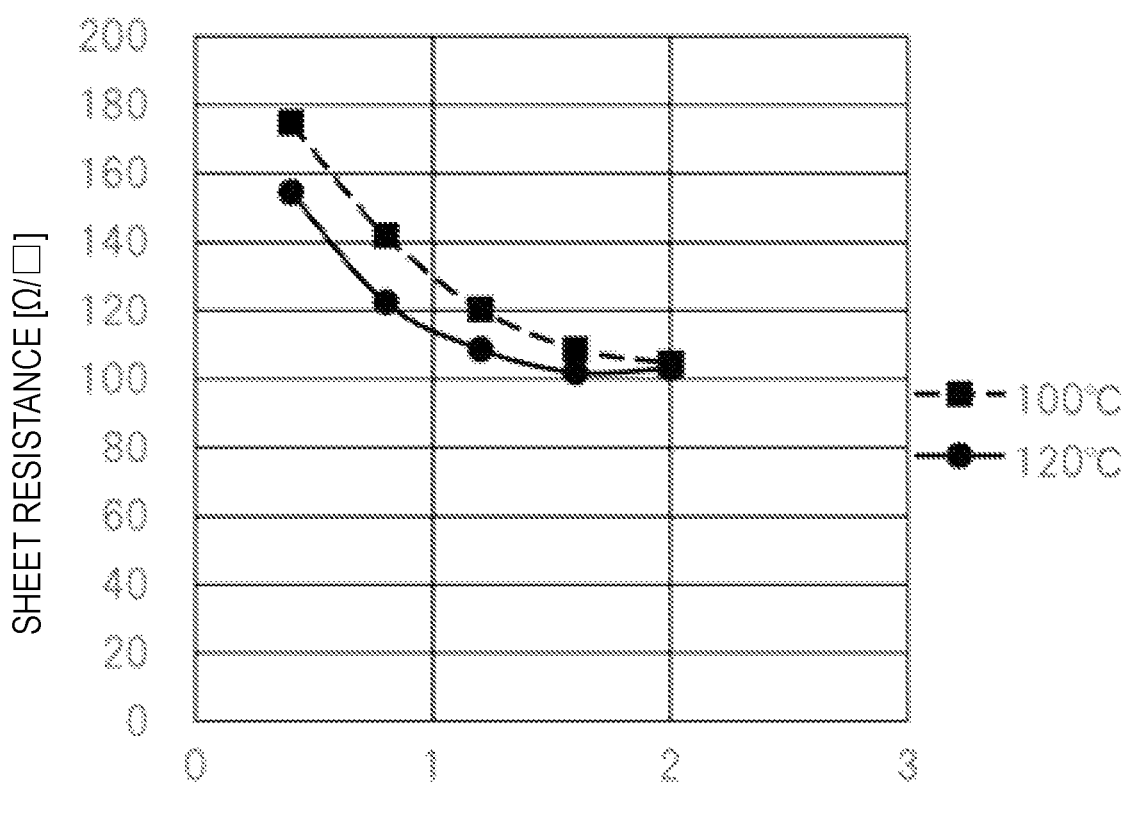
FIG. 15 is a chart illustrating the sheet resistances of ITO films in relation to oxygen flow rate.

This section describes an example of producing an ITO lower conductive layer and an ITO upper conductive layer by sputtering. The sputtering can produce ITO films different in crystallinity and resistivity, depending on the substrate temperature and the oxygen flow rate (hereinafter, also expressed as O flow rate) in the film formation. FIG. 15 is a chart illustrating the sheet resistances of ITO films in relation to the O flow rate. FIG. 15 provides the sheet resistances of ITO films having a thickness of 40 nm in relation to the O flow rate in the cases where the substrate temperature in the film formation was 100° C. and 120° C.

It is known that ITO has a higher oxygen concentration when the O flow rate in film formation is higher. Accordingly, it can be said that the horizontal axis of FIG. represents the oxygen concentration of the ITO. Although FIG. 15 indicates the sheet resistance, the sheet resistance and the resistivity have the following relation:

$$\rho = R\square \times d \qquad \text{(Formula 1)}$$

$\rho$: resistivity
$R\square$: sheet resistance
d: film thickness

Formula 1 indicates that the relation of the sheet resistance is the same as the relation of the resistivity as far as the film thickness is the same.

As indicated in FIG. 15, the sheet resistance of an ITO film is minimized when the film is formed under a specific O flow rate and increases as the O flow rate deviates from the specific flow rate, regardless of the substrate temperature in the film formation. Especially, the tendency of increase in sheet resistance is prominent as the O flow rate decreases from a certain flow rate.

Such characteristics are to be considered to determine the conditions of sputtering so that the upper conductive layer UCL treated with oxygen plasma at a subsequent Step S60 will have a minimum resistivity. For example, an experiment is conducted beforehand under different conditions in forming an ITO film (such as the substrate temperature, the O flow rate, the discharge power, and the composition of the ITO target in film formation) and in plasma treatment (such as the plasma discharge power, the treatment time, and the O flow rate), and the sputtering conditions are determined in view of the results of this experiment. In the following description, oxygen plasma can also be expressed as O plasma. In the case of forming an ITO film by a method other than sputtering or forming an upper conductive layer UCL made of a material other than ITO, the conditions in forming the film can be determined appropriately.

At Step S20, the method deposits an insulating layer IL (for example, a SiN film) containing hydrogen (H) above the anode electrode AN and the bank layer BNK. The insulating layer IL can be formed by coating or chemical vapor deposition. The temperature in forming the insulating layer IL should be not higher than the baking temperature of the bank layer BNK and the planarization layer PLN (for example, approximately 200° C.) so that the inclined wall region 712 of the bank layer BNK and the planarization layer PLN forming a bank will not transubstantiate. If this insulating layer IL is excessively thin, insulation breakdown may occur because of the voltage between the anode electrode and the cathode electrode and the current may not flow to the organic layers OEL to be deposited thereabove and light cannot be emitted. For this reason, it is preferable that the insulating layer IL have a thickness of 10 nm or more.

Baking treatment can be added before depositing the insulating layer IL at Step S20. The bank layer BNK made of a polyimide or acrylic resin organic film adsorbs moisture when being left for a long time. This moisture interferes with the adhesion to the insulating layer IL, if its quantity is large. In addition, if the baking conditions for the bank layer BNK are inappropriate, organic gas is emitted from the bank layer BNK in the subsequent heat treatment.

Figure 26:
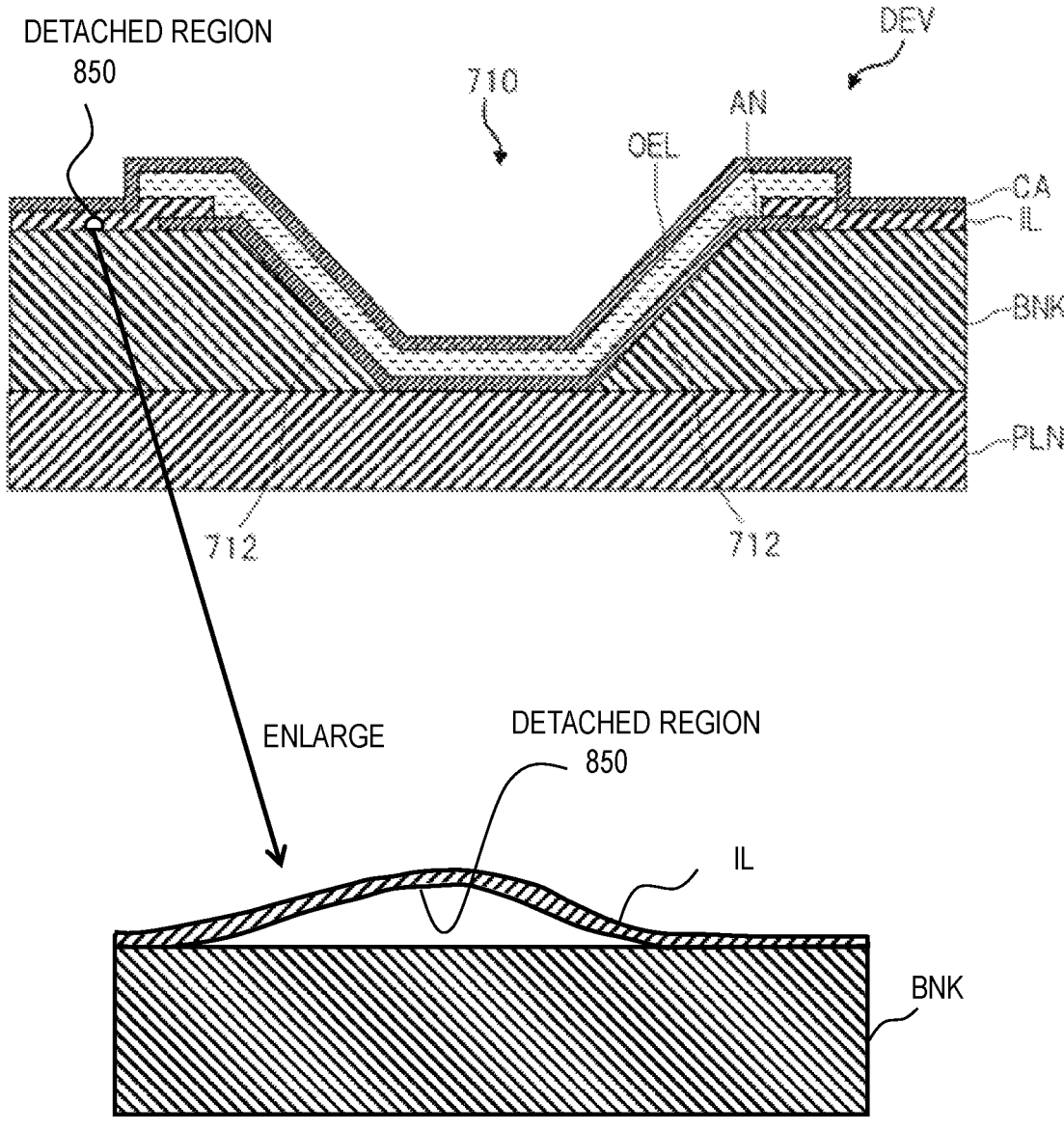
FIG. 26 illustrates a detached region generated in the vicinity of an organic EL device with an enlarged view of the detached region.

If removing these moisture and gas is insufficient before depositing the insulating layer IL, the insulating layer IL may be detached from the bank layer BNK, as illustrated in FIG. 26. FIG. 26 illustrates a detached region 850 generated in the vicinity of an organic EL device with an enlarged view of the detached region 850. The reason why the detachment occurs is that the moisture and the gas cannot pass through the insulating layer IL but accumulate between the insulating layer IL and the bank layer BNK, in the case where the insulating layer IL is a dense film made of SiN, for example.

Accordingly, baking treatment is added before depositing the insulating layer IL to promote removal of the moisture and the gas, preventing the interference with adhesion. A preferable example of the baking treatment is treatment in a nitrogen atmosphere of about 200° C. for one hour.

At step S30, the method deposits a resist RES above the insulating layer and patterns the resist RES. As a result of patterning, the resist RES remains only in the region to have the insulating layer IL.

At Step S40, the method performs dry etching in the state where the resist RES is remaining on the insulating layer to remove the insulating layer exposed from the resist RES. At Step S50, the method removes the resist RES. As a result, the insulating layer IL is formed to have a predetermined shape. As described above, the insulating layer IL is produced through a series of steps from Step S20 to Step S50.

At Step S60, the method treats the upper conductive layer UCL (see FIG. 9) of the anode electrode AN exposed from the insulating layer IL with O plasma. Examples of the conditions for the O plasma treatment can be an O flow rate of 500 sccm, a pressure of 50 Pa, a plasma discharge power of 1.0 W/cm², and a treatment time of 120 sec.

At Step S70, the method deposits organic layers OEL above the anode electrode AN and a part of the insulating layer IL. At Step S80, the method deposits a semi-transparent reflective metal thin film for the cathode electrode CA above the organic layers OEL and the insulating layer IL.

Effect of Insulating Layer onto Second Upper Conductive Layer

Figure 16:
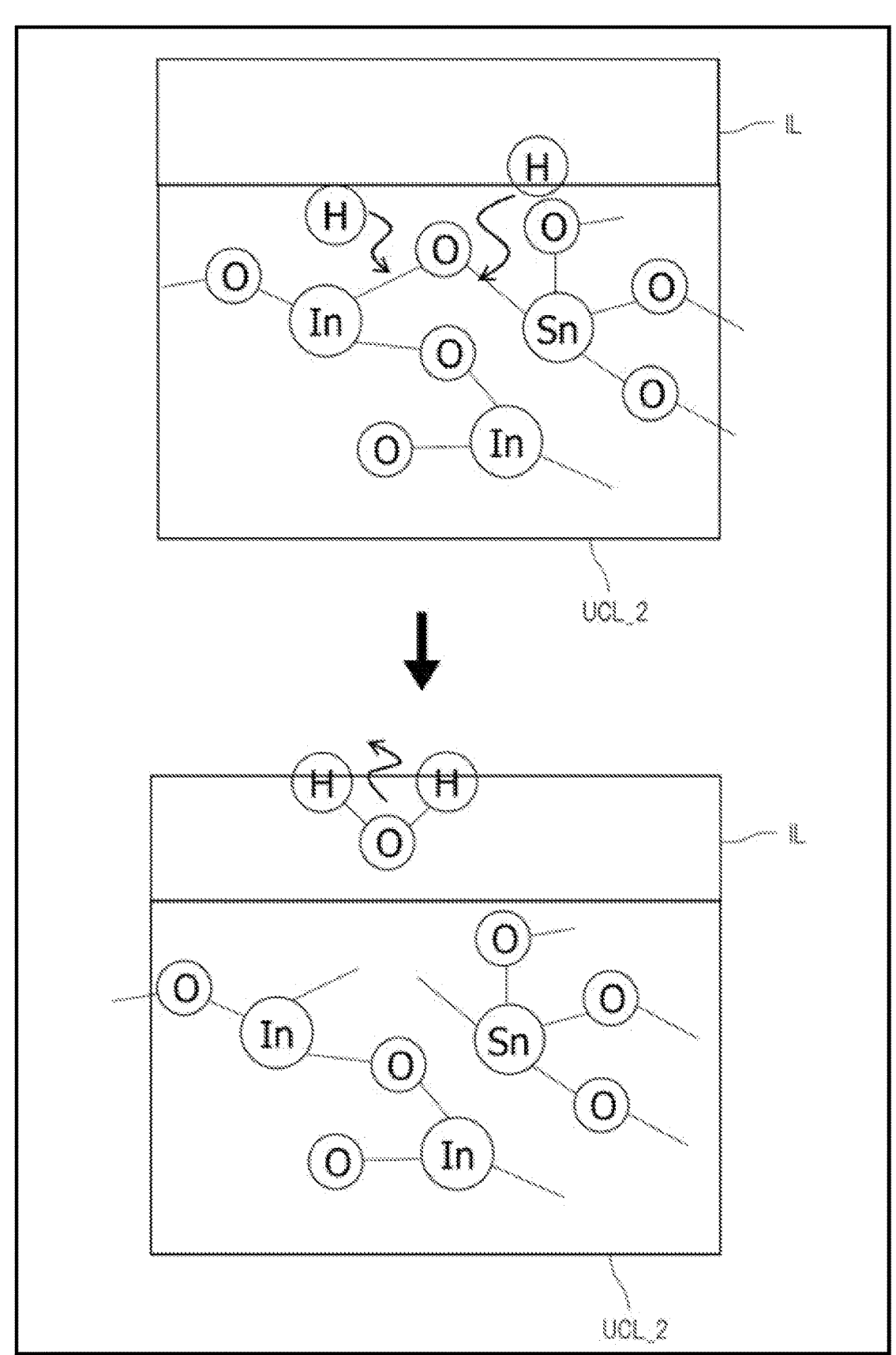
FIG. 16 is a diagram illustrating effect of the insulating layer onto the second upper conductive layer.

FIG. 16 is a diagram illustrating effect of the insulating layer onto the second upper conductive layer. As illustrated in the upper part of FIG. 16, hydrogen radicals (denoted by H in FIG. 16) are generated in the insulating layer IL in forming the H-containing insulating layer IL (Step S20 in FIG. 13). The hydrogen radicals enter the second upper conductive layer UCL_2 from the insulating layer IL. The hydrogen radicals that have entered the second upper conductive layer UCL_2 react with the oxygen (O) in the second upper conductive layer UCL_2. Some oxygen in the second upper conductive layer UCL_2 turns into OH⁻ or $H_2O$ and escapes from the second upper conductive layer UCL_2, as illustrated in the lower part of FIG. 16. As a result, the oxygen content in the second upper conductive layer UCL_2 in contact with the insulating layer IL decreases.

Effect of O Plasma Treatment onto Upper Conductive Layer

Figure 17:
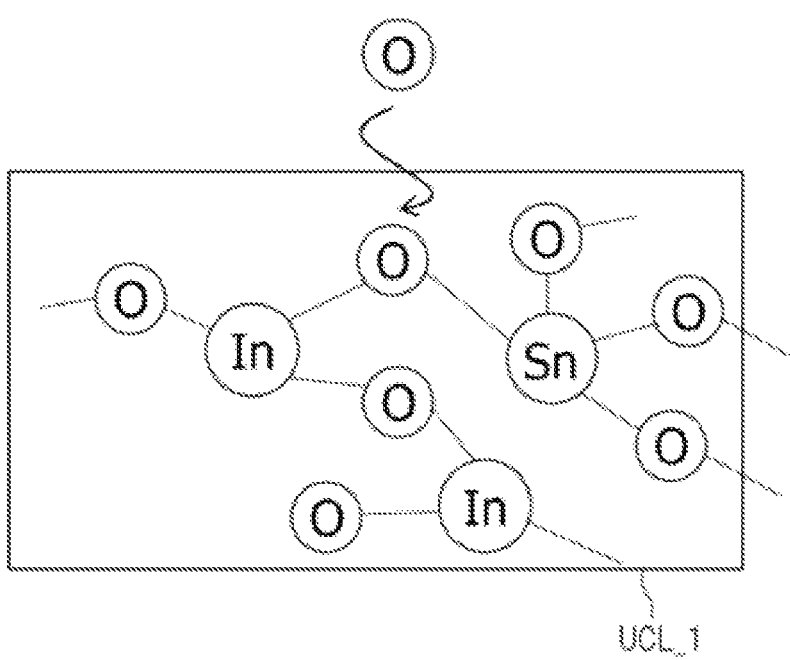
FIG. 17 is a diagram illustrating effect of O plasma treatment onto the first upper conductive layer UCL_1.
Figure 18:
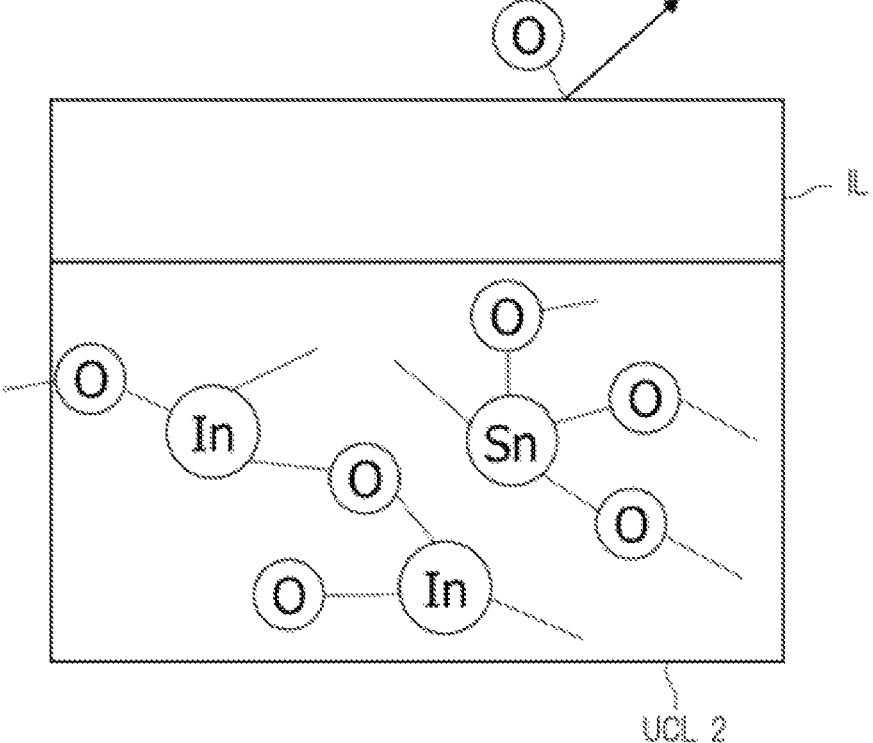
FIG. 18 is a diagram illustrating effect of O plasma treatment onto the second upper conductive layer UCL_2.

FIG. 17 is a diagram illustrating effect of O plasma treatment onto the first upper conductive layer UCL_1. FIG. 18 is a diagram illustrating effect of O plasma treatment onto the second upper conductive layer UCL_2. Oxygen radicals (denoted by O in FIGS. 17 and 18) are generated in O plasma treatment (Step S60 in FIG. 13). The oxygen radicals enter the first upper conductive layer UCL_1 that is not covered with (not in contact with) the insulating layer IL, as illustrated in FIG. 17. As a result, the oxygen content in the first upper conductive layer UCL_1 or the region not covered with the insulating layer IL increases.

However, oxygen radicals are hard to pass through the insulating layer IL, as illustrated in FIG. 18. For this reason, the second upper conductive layer UCL_2 covered with (in contact with) the insulating layer IL receives little effect of oxygen radicals. Accordingly, the oxygen content in the second upper conductive layer UCL_2 does not vary in the O plasma treatment. As a result of these effects, the second upper conductive layer UCL_2 has a lower oxygen content than the first upper conductive layer UCL_1.

Major Effects of this Embodiment

In this embodiment, the anode electrode AN including a reflective metal layer RML is provided on the inclined wall region 712 of the bank layer BNK defining an opening 710 forming a bank. This configuration makes the light coming from the organic layers OEL reflect off the reflective metal layer RML toward the cathode electrode CA and the light propagating in the horizontal direction of the panel go out to the front, which increases the light extraction efficiency. Hence, higher frontal brightness is attained.

In this embodiment, the second upper conductive layer UCL_2 (see FIG. 9) has a lower oxygen content than the first upper conductive layer UCL_1 and therefore, the electron mobility in the second upper conductive layer UCL_2 is lower than that in the first upper conductive layer UCL_1. The second upper conductive layer UCL_2 has a higher resistivity than the first upper conductive layer UCL_1.

This configuration suppresses the quantity of the holes injected to the organic layers OEL above the insulating layer IL through the insulating layer IL and therefore, the leak current in the insulating layer IL decreases. As a result, light emission of the organic layers OEL is suppressed in the region above the insulating layer IL, providing a light-emitting area as designed. Furthermore, the light horizontally propagating in the insulating layer IL can be reduced by thinning the insulating layer IL; more increase in light-extraction efficiency is available.

In addition, this configuration enables efficient hole injection from the first upper conductive layer UCL_1 into the hole injection layer HIL of the organic layers OEL without interference with the movement of the holes. As a result, increase in light-extraction efficiency is available without raising the driving voltage of the organic EL device DEV.

Furthermore, the organic EL display apparatus 10 including the organic EL device DEV in this embodiment in each pixel can display high-quality images while saving the power consumption.

Practical Examples

Figure 19:
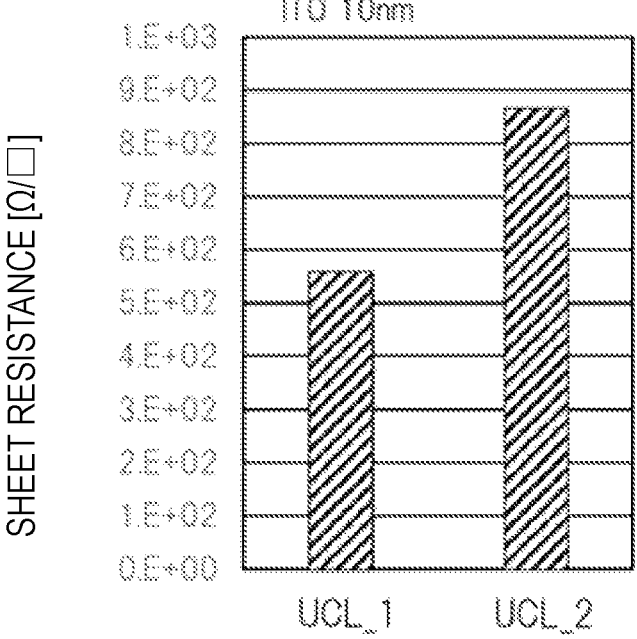
FIG. 19 is a chart indicating sheet resistances measured from the first upper conductive layer and the second upper conductive layer in comparison to each other.

Practical examples of Embodiment 1 are described. FIG. 19 is a chart indicating sheet resistances measured from the first upper conductive layer and the second upper conductive layer in comparison to each other. The thickness of the upper conductive layer UCL (UCL_1 and UCL_2) was 10 nm; the oxygen concentration of the first upper conductive layer UCL_1 was 60.2%; and the oxygen concentration of the second upper conductive layer UCL_2 was 58.3%. As indicated in FIG. 19, the sheet resistance of the first upper conductive layer UCL_1 was between 500 and 600Ω/□ and the sheet resistance of the second upper conductive layer UCL_2 was between 800 and 900Ω/□. As described above, the oxygen concentration (or oxygen content) of the first upper conductive layer UCL_1 is higher than that of the second upper conductive layer UCL_2 and the resistivity of the second upper conductive layer UCL_2 is higher than that of the first upper conductive layer UCL_1.

FIG. 20 is a chart demonstrating effects of Embodiment 1. FIG. 20 indicates whether intended effects are attained with SiN films (insulating layers IL) having different thicknesses in a table format. FIG. 20 also provides the results on the samples in which the second upper conductive layer UCL_2 and the first upper conductive layer UCL_1 have an equal oxygen content, for comparison.

As indicated in FIG. 20, in the cases of 200-nm thick SiN films, the both samples in which the oxygen content in the second upper conductive layer UCL_2 is lower than and equal to the oxygen content in the first upper conductive layer UCL_1 have intended light-emitting areas. The sample having the configuration of this disclosure provides 1.15 times the frontal brightness of the sample having a conventional configuration. The reason of increase in frontal brightness is increase in light-extraction efficiency by thinning the insulating layer IL to reduce the light entering the insulating layer IL.

Figure 28:
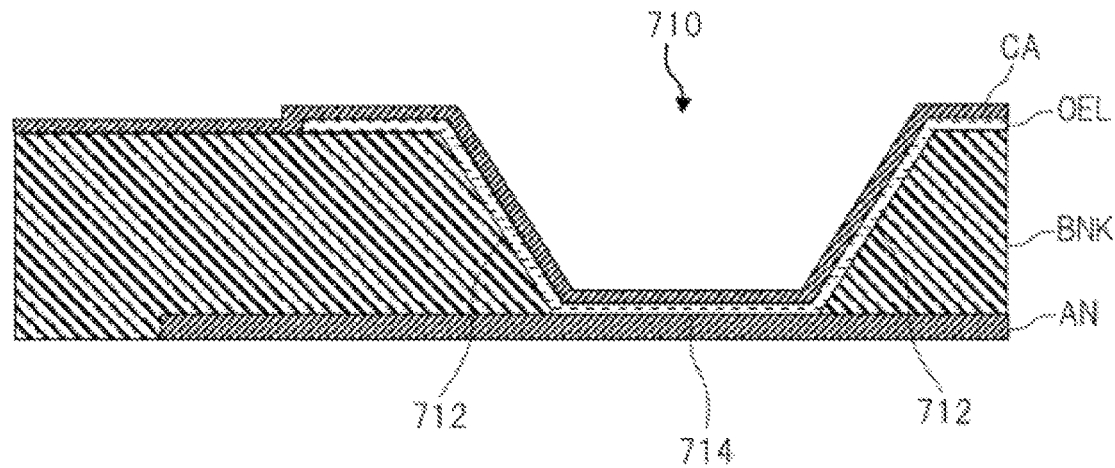
FIG. 28 is a cross-sectional diagram schematically illustrating an example of the configuration of the vicinity of a pixel including a conventional organic EL device.

FIG. 28 is a cross-sectional diagram schematically illustrating an example of the configuration of the vicinity of a pixel including a conventional organic EL device. FIG. 28 does not include the configuration for supplying electric current to the anode electrode AN, like FIG. 5 and some other drawings. As illustrated in FIG. 28, the anode electrode AN in the conventional configuration is provided under the bank layer BNK and it is exposed from the bottom region 714 of the opening 710. That is to say, the anode electrode AN is not provided either above the top face of the bank layer BNK or on the inclined wall region 712 defining the opening 710. The organic layers OEL are provided above the bank layer BNK and in the opening 710. A part of the light emitted from the organic layers OEL enters the bank layer BNK. Accordingly, this conventional configuration provides lower light-extraction efficiency and frontal brightness than the configuration of this disclosure.

In the cases of 100-nm thick SiN films, the both samples in which the oxygen content in the second upper conductive layer UCL_2 is lower than and equal to the oxygen content in the first upper conductive layer UCL_1 have intended light-emitting areas. The sample having the configuration of this disclosure provides 1.17 times the frontal brightness of the sample having the conventional configuration.

Regarding the cases of 50-nm thick SiN films, the sample in which the second upper conductive layer UCL_2 has a lower oxygen content than the first upper conductive layer UCL_1 has an intended light-emitting area. The sample having the configuration of this disclosure provides 1.19 times the frontal brightness of the sample having the conventional configuration. In view of these results, it is confirmed that an intended light-emitting area is attained when the second upper conductive layer UCL_2 has a lower oxygen content than the first upper conductive layer UCL_1. It is also confirmed that the frontal brightness or the light-extraction efficiency increases as the SiN film becomes thinner.

However, the sample in which the SiN film has a thickness of 50 nm and the oxygen content in the second upper conductive layer UCL_2 is equal to the oxygen content in the first upper conductive layer UCL_1 has a light-emitting area larger than intended. This is because leak current occurs in the SiN film and the organic layers OEL in the region above the SiN film emits light. Since this sample has a different size of light-emitting area from the sample having the other structure, comparison of the frontal brightness is not conducted.

Embodiment 2

Figure 21:
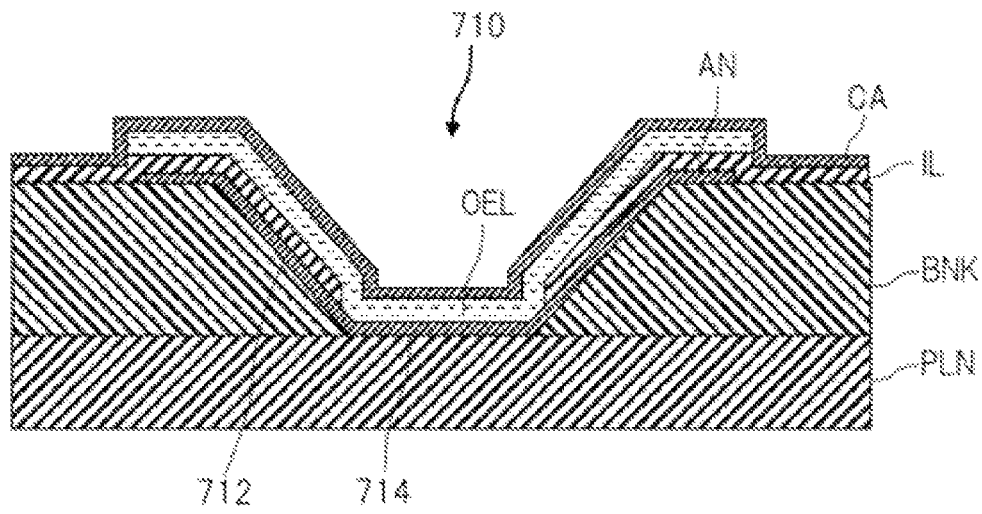
FIG. 21 is a cross-sectional diagram illustrating another example of an organic EL device.
Figure 22:
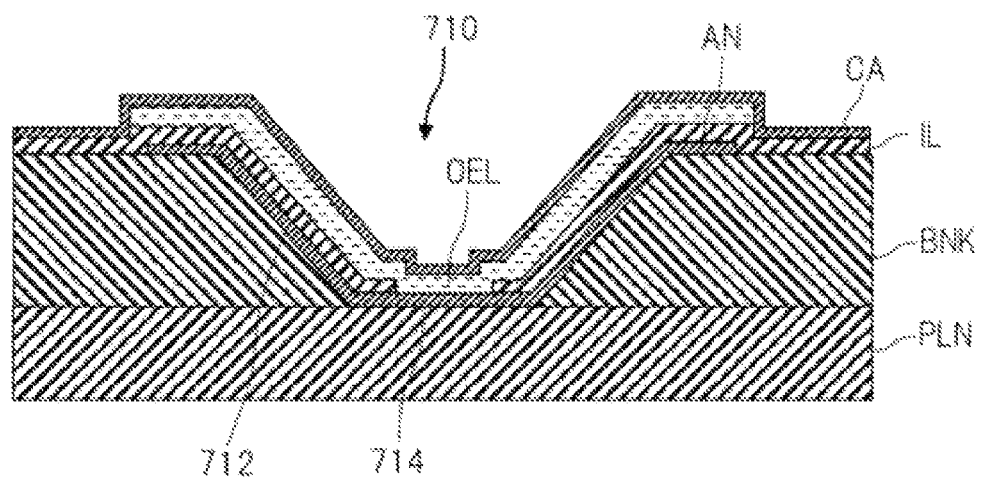
FIG. 22 is a cross-sectional diagram illustrating still another example of an organic EL device.

Embodiment 2 is described. This embodiment provides other configurations of an organic EL device. FIGS. 21 and 22 are cross-sectional diagrams illustrating other examples of organic EL devices. FIGS. 21 and 22 illustrate only the configurations of the planarization layer PLN and the layers upper than the planarization layer PLN and do not include the configuration for supplying electric current to the anode electrode AN, like FIG. 5 and some other drawings.

FIG. 21 illustrates an example where the insulating layer IL is provided from the top face of the bank layer BNK to the middle of the inclined wall region 712 defining the opening 710. FIG. 22 illustrates an example where the insulating layer IL is provided from the top face of the bank layer BNK to the middle of the bottom region 714 of the opening 710 or the region to partially cover the anode electrode AN on the planarization layer PLN. The effects obtained in Embodiment 1 can be obtained in both configurations in FIGS. 21 and 22.

Figure 23:
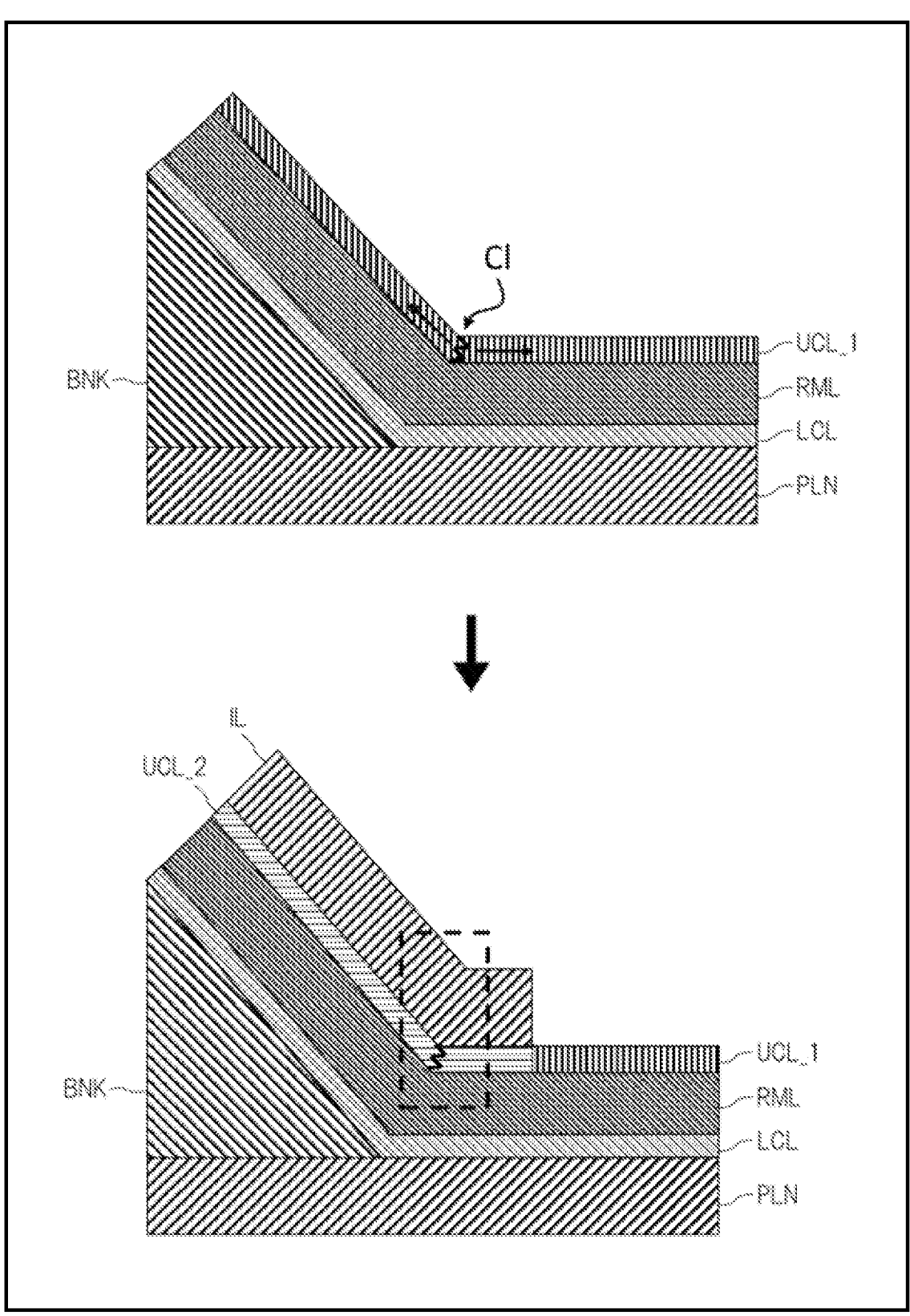
FIG. 23 is a diagram illustrating an additional effect of the configuration in FIG. 22.

FIG. 23 is a diagram for illustrating an additional effect of the configuration in FIG. 22. The upper conductive layer UCL of the anode electrode AN has a very small film thickness (for example, 5 nm to 30 nm). For this reason, thermal treatment after film formation causes the upper conductive layer UCL to expand and contract to generate a crack in its bending part around the boundary between the inclined wall region 712 and the bottom region 714 (see the upper part of FIG. 23). As a result, the metal (for example, Ag) of the reflective metal layer RML may react to substances such as chlorine (Cl) and sulfur (S) in the ambient air through this crack to generate an Ag precipitation. Such a precipitate may cause a short circuit between the anode electrode AN and the cathode electrode CA or a breaking in the anode electrode AN or the cathode electrode CA.

To address this issue, the insulating layer IL is provided from the top face of the bank layer BNK to the middle of the bottom region 714 of the opening 710 to protect the bending part of the upper conductive layer UCL around the boundary between the inclined wall region 712 and the bottom region 714 with the insulating layer IL (see the lower part of FIG. 23). This configuration suppresses the generation of the precipitate in the reflective metal layer RML; the short circuit between the anode electrode AN and the cathode electrode CA and the breaking in the anode electrode AN or the cathode electrode CA can be prevented.

Embodiment 3

Figure 24:
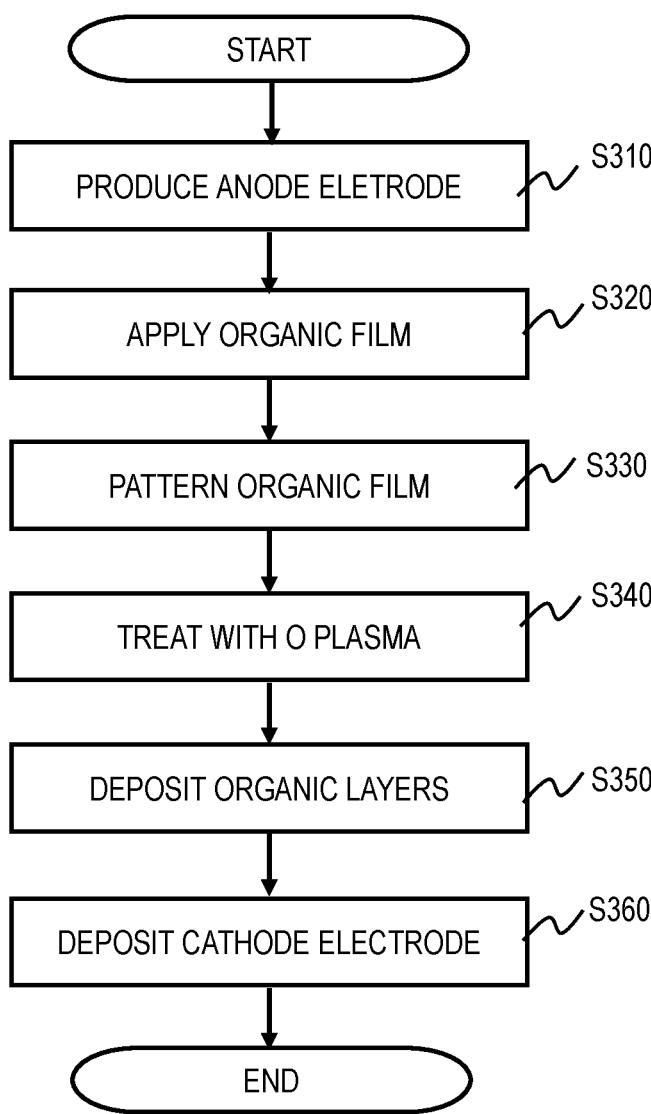
FIG. 24 is a flowchart of a method of manufacturing an organic EL device in Embodiment 3.
Figure 25:
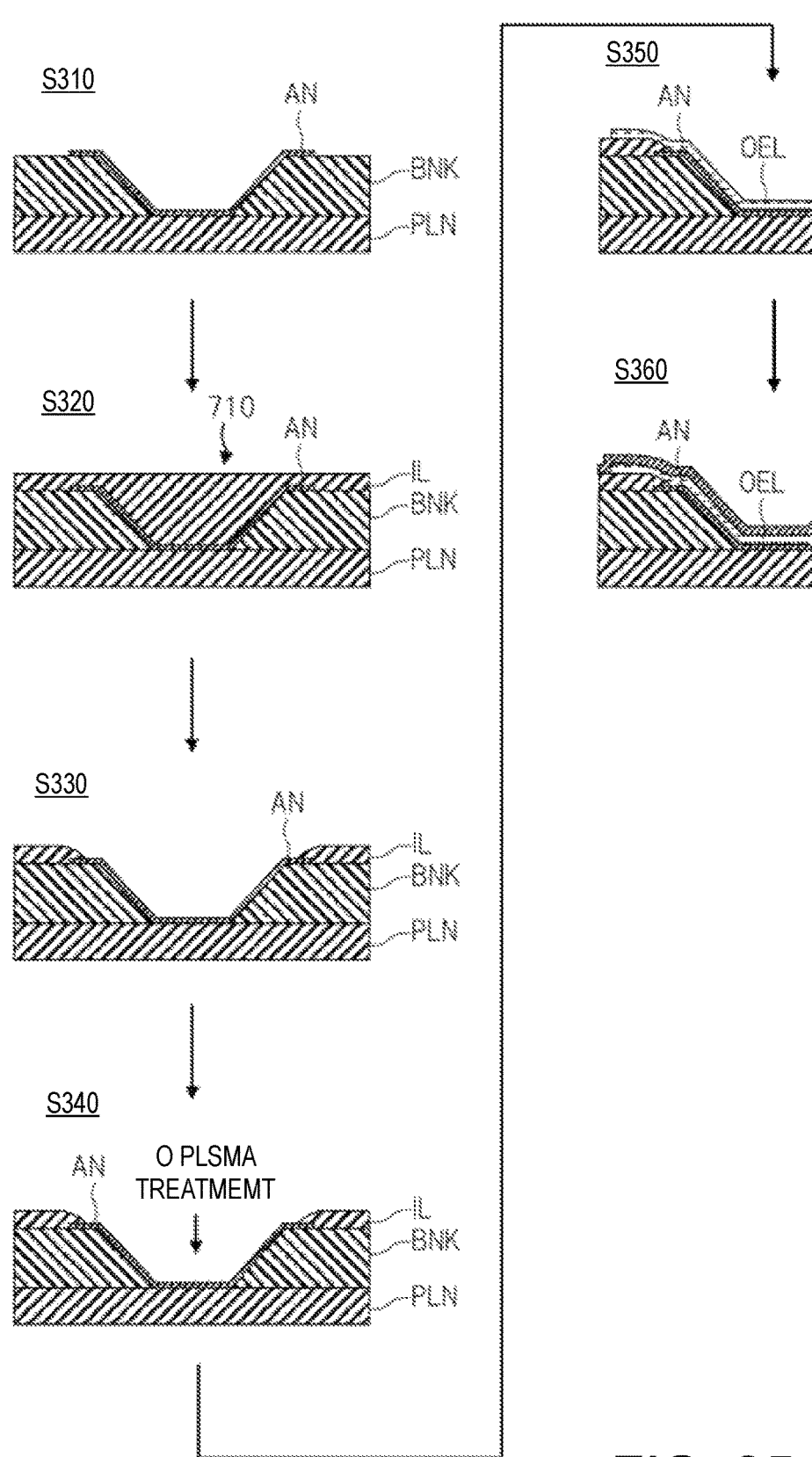
FIG. 25 is a diagram illustrating the process steps in manufacturing an organic EL device that correspond to FIG. 24.

Embodiment 3 is described. This embodiment provides a manufacturing process in the case where a hardly-oxidized organic film, such as a fluorine-based polymer film, is employed for the insulating layer IL. FIG. 24 is a flowchart of a method of manufacturing an organic EL device in Embodiment 3. FIG. 25 is a diagram illustrating the process steps in manufacturing an organic EL device that correspond to FIG. 24. FIG. 25 illustrates only the configuration of the planarization layer PLN and the layers upper than the planarization layer PLN and does not include the configuration for supplying electric current to the anode electrode AN, like FIG. 14 and some other drawings.

As illustrated in FIG. 24, the manufacturing method in this embodiment includes Steps S310 to S360. At Step S310, the method produces an anode electrode AN, like at Step S10 in FIG. 13.

At Step S320, the method deposits a hardly-oxidized organic film to cover the bank layer BNK and the opening 710 by coating. The organic film can be deposited by a method other than coating. At Step S330, the method patterns the hardly-oxidized organic film. This patterning can be performed by lithographic exposure, development, or still another method. Through this step, an insulating layer IL of a hardly-oxidized organic film is prepared.

At Step S340, O plasma treatment is performed like at Step S60 in FIG. 13. Examples of the conditions for the O plasma treatment can be an O flow rate of 300 sccm, a pressure of 30 Pa, a plasma discharge power of 0.4 W/cm², and a treatment time of 150 sec.

At Step S350, the method deposits organic layers OEL like at Step S70 in FIG. 13. At Step S360, the method produces a cathode electrode CA like at Step S80 in FIG. 13.

Even in the case where a hardly-oxidized organic film is used as the insulating layer IL as described above, the oxygen content of the second upper conductive layer UCL_2 in contact with the insulating layer IL does not increase in the O plasma treatment at Step S340. As a result, the second upper conductive layer UCL_2 has an oxygen content lower than the first upper conductive layer UCL_1 and hence, the second upper conductive layer UCL_2 has a higher resistivity than the first upper conductive layer UCL_1.

Accordingly, even in the case where a hardly-oxidized organic film is used as the insulating layer IL, the effects of Embodiment 1 are attained. In addition, the insulating layer IL can have the configuration described in Embodiment 2. Then, the effects of Embodiment 2 are attained even in the case where a hardly-oxidized organic film is used as the insulating layer IL.

Embodiment 4

Figure 27A:
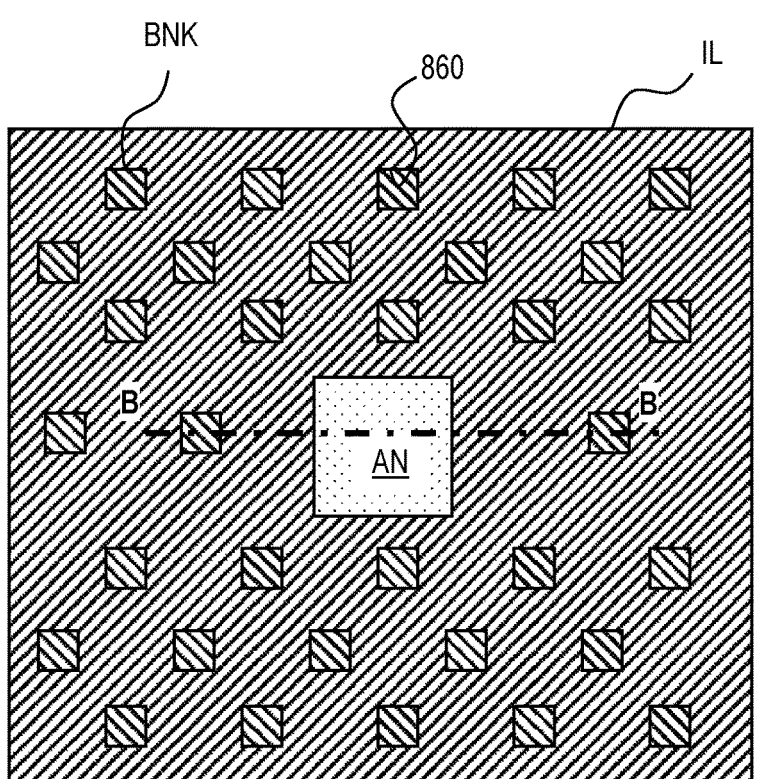
FIG. 27A is a top plan diagram illustrating a pattern of a plurality of pores opened in the insulating layer IL.
Figure 27B:
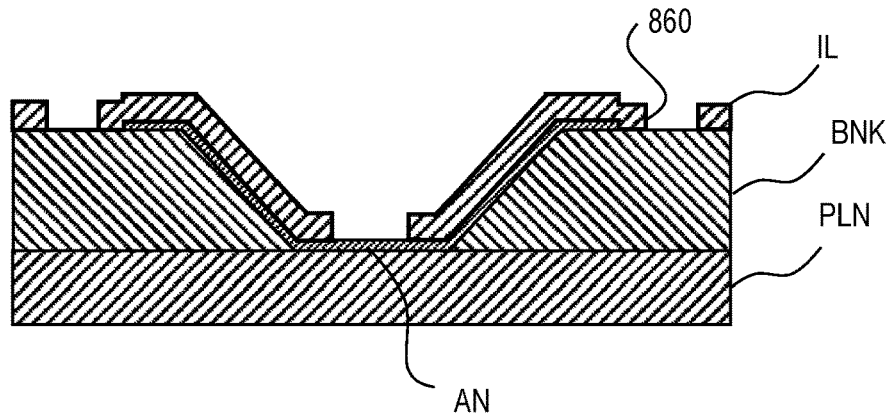
FIG. 27B is a cross-sectional diagram illustrating the cross-sectional structure along the section line B-B in FIG. 27A.

Embodiment 4 is described based on a practical example. FIG. 27A is a top plan diagram illustrating a pattern of a plurality of pores 860 provided in the insulating layer IL. FIG. 27B is a cross-sectional diagram illustrating the cross-sectional structure along the section line B-B in FIG. 27A. In FIG. 27A, one of the plurality of pores is provided with a reference sign 860 and a part of the bank layer exposed from one pore 860 is provided with a reference sign BNK, by way of example.

As illustrated in FIGS. 27A and 27B, the insulating layer IL can have moderate pores 860 opened by etching to transmit moisture adsorbed on the bank layer BNK and gas generated from the bank layer BNK. For these pores 860, a pattern having a plurality of approximately 20 m squares can be selected, for example. The shape of each pore 860 is not limited to squares but can be selected desirably.

The process to open the pores 860 in the insulating layer IL includes depositing a resist, patterning the resist, applying dry etching, and removing the resist immediately after producing the insulating layer IL. The pores prevent moisture or gas from accumulating between the insulating layer IL and the bank layer BNK as described above, hindering detachment of the insulating layer IL from the bank layer BNK. Opening the pores in the insulating layer IL can be combined with the aforementioned baking treatment preceding Step S20.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An organic EL device comprising:
organic layers;
an anode electrode configured to inject holes into the organic layers;
a cathode electrode configured to inject electrons into the organic layers; and
an insulating layer covering a part of the anode electrode,
wherein the anode electrode is disposed above a bank layer and in an opening of the bank layer,
wherein the organic layers are disposed to cover the anode electrode and a part of the insulating layer,
wherein the anode electrode includes a lower conductive layer, a reflective metal layer that reflects light coming from the organic layers, and a light-transmissive upper conductive layer layered in this order toward the cathode electrode,
wherein the upper conductive layer includes a first upper conductive layer connected to the organic layers and a second upper conductive layer covered with the insulating layer,
wherein the second upper conductive layer has a lower oxygen content than the first upper conductive layer, and
wherein the second upper conductive layer has a higher resistivity than the first upper conductive layer.

2. The organic EL device according to claim 1, wherein the upper conductive layer is a transparent conductive oxide film.

3. The organic EL device according to claim 2, wherein the transparent conductive oxide film contains ITO or IZO.

4. The organic EL device according to claim 1, wherein the anode electrode is partially covered with the insulating layer disposed above the bank layer.

5. The organic EL device according to claim 1, wherein the insulating layer is spread from a top face of the bank layer to a middle of a bottom region of the opening.

6. The organic EL device according to claim 1, wherein the insulating layer has a plurality of pores.

7. A display apparatus comprising the organic EL device according to claim 1.

8. A method of manufacturing an organic EL device, the method comprising:

a step of producing an anode electrode including a lower conductive layer, a reflective metal layer, and a light-transmissive upper conductive layer layered in this order toward a cathode electrode above a bank layer and in an opening of the bank layer;

a step of producing an insulating layer covering a part of the anode electrode; and a step of applying oxygen plasma treatment to the upper conductive layer of the anode electrode exposed from the insulating layer.

9. The method according to claim 8, wherein the step of producing an insulating layer produces an insulating layer containing hydrogen.

* * * * *